(12) United States Patent
Kurokawa et al.

(10) Patent No.: US 9,680,476 B2
(45) Date of Patent: Jun. 13, 2017

(54) PROGRAMMABLE LOGIC DEVICE

(71) Applicant: Semiconductor Energy Laboratory Co., Ltd., Atsugi-shi, Kanagawa-ken (JP)

(72) Inventors: Yoshiyuki Kurokawa, Kanagawa (JP); Takayuki Ikeda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/163,817

(22) Filed: May 25, 2016

(65) Prior Publication Data
US 2016/0269032 A1 Sep. 15, 2016

Related U.S. Application Data

(63) Continuation of application No. 14/684,492, filed on Apr. 13, 2015, now Pat. No. 9,356,601, which is a
(Continued)

(30) Foreign Application Priority Data

May 30, 2012 (JP) ................................. 2012-123061

(51) Int. Cl.
*H03K 19/177* (2006.01)
*H03K 19/0944* (2006.01)
*H03K 19/173* (2006.01)

(52) U.S. Cl.
CPC ..... *H03K 19/1776* (2013.01); *H03K 19/0944* (2013.01); *H03K 19/177* (2013.01);
(Continued)

(58) Field of Classification Search
CPC ................... H03K 19/17736; H03K 19/17724
(Continued)

(56) References Cited

U.S. PATENT DOCUMENTS

| | | |
|---|---|---|
| 5,352,940 A | 10/1994 | Watson |
| 5,731,856 A | 3/1998 | Kim et al. |
| 5,744,864 A | 4/1998 | Cillessen et al. |
| 5,808,942 A | 9/1998 | Sharpe-Geisler |
| 6,057,704 A | 5/2000 | New et al. |
| 6,127,702 A | 10/2000 | Yamazaki et al. |
| 6,150,838 A | 11/2000 | Wittig et al. |
| 6,172,521 B1 | 1/2001 | Motomura |
| 6,208,163 B1 | 3/2001 | Wittig et al. |
| 6,288,569 B1 | 9/2001 | Wittig et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

(Continued)

*Primary Examiner* — Jason M Crawford
(74) *Attorney, Agent, or Firm* — Fish & Richardson P.C.

(57) ABSTRACT

A PLD in which a configuration memory is formed using a nonvolatile memory with a small number of transistors and in which the area of a region where the configuration memory is disposed is reduced is provided. Further, a PLD that is easily capable of dynamic reconfiguration and has a short startup time is provided. A programmable logic device including a memory element, a selector, and an output portion is provided. The memory element includes a transistor in which a channel is formed in an oxide semiconductor film, and a storage capacitor and an inverter which are connected to one of a source and a drain of the transistor. The inverter is connected to the selector. The selector is connected to the output portion.

13 Claims, 16 Drawing Sheets

Related U.S. Application Data continuation of application No. 13/901,644, filed on May 24, 2013, now Pat. No. 9,007,093.

(52) U.S. Cl.
CPC ... H03K 19/1737 (2013.01); H03K 19/17772 (2013.01); H03K 19/17776 (2013.01)

(58) Field of Classification Search
USPC .......................... 326/37–41, 47; 365/189.08
See application file for complete search history.

(56) References Cited

U.S. PATENT DOCUMENTS

| | | |
|---|---|---|
| 6,294,274 B1 | 9/2001 | Kawazoe et al. |
| 6,396,302 B2 | 5/2002 | New et al. |
| 6,400,180 B2 | 6/2002 | Wittig et al. |
| 6,501,296 B2 | 12/2002 | Wittig et al. |
| 6,563,174 B2 | 5/2003 | Kawasaki et al. |
| 6,603,332 B2 | 8/2003 | Kaviani et al. |
| 6,630,841 B2 | 10/2003 | New et al. |
| 6,727,522 B1 | 4/2004 | Kawasaki et al. |
| 6,847,229 B2 | 1/2005 | New et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,084,665 B1 | 8/2006 | Lewis et al. |
| 7,105,868 B2 | 9/2006 | Nause et al. |
| 7,145,360 B2 | 12/2006 | New et al. |
| 7,196,942 B2 | 3/2007 | Khurana et al. |
| 7,211,825 B2 | 5/2007 | Shih et al |
| 7,248,073 B2 | 7/2007 | New et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,248,101 B2 | 8/2012 | Voogel et al. |
| 8,339,828 B2 | 12/2012 | Yamazaki et al. |
| 8,619,454 B2 | 12/2013 | Yamazaki et al. |
| 8,804,396 B2 | 8/2014 | Yamazaki et al. |
| 9,007,093 B2 | 4/2015 | Kurokawa et al. |
| 9,135,958 B2 | 9/2015 | Yamazaki et al. |
| 9,202,546 B2 | 12/2015 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0151883 A1* | 7/2006 | Arakawa ............ H01L 27/0207 257/758 |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0243652 A1 | 10/2009 | Dorairaj et al. |
| 2009/0278122 A1 | 11/2009 | Hosono et al. |
| 2009/0280600 A1 | 11/2009 | Hosono et al. |
| 2010/0039138 A1 | 2/2010 | Bertin |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0175646 A1 | 7/2011 | Takemura et al. |
| 2012/0099360 A1 | 4/2012 | Takemura |
| 2012/0293200 A1 | 11/2012 | Takemura |
| 2012/0293201 A1 | 11/2012 | Fujita et al. |
| 2012/0293202 A1 | 11/2012 | Nishijima et al. |
| 2012/0293206 A1 | 11/2012 | Yoneda et al. |
| 2012/0293209 A1 | 11/2012 | Takewaki |
| 2012/0293242 A1 | 11/2012 | Kato |
| 2013/0207170 A1 | 8/2013 | Kurokawa |
| 2013/0285697 A1 | 10/2013 | Kurokawa |
| 2013/0285698 A1 | 10/2013 | Fukutome |
| 2013/0286757 A1 | 10/2013 | Takemura |
| 2013/0293262 A1 | 11/2013 | Takemura |
| 2013/0293263 A1 | 11/2013 | Kurokawa |
| 2015/0364606 A1 | 12/2015 | Yamazaki et al. |
| 2016/0079245 A1 | 3/2016 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |

(56) References Cited

FOREIGN PATENT DOCUMENTS

| | | |
|---|---|---|
| JP | 63-239117 A | 10/1988 |
| JP | 63-265818 A | 11/1988 |
| JP | 05-251705 A | 9/1993 |
| JP | 06-140904 A | 5/1994 |
| JP | 08-264794 A | 10/1996 |
| JP | 10-285014 A | 10/1998 |
| JP | 11-505377 | 5/1999 |
| JP | 11-154857 A | 6/1999 |
| JP | 2000-044236 A | 2/2000 |
| JP | 2000-150900 A | 5/2000 |
| JP | 3106998 | 11/2000 |
| JP | 2002-076356 A | 3/2002 |
| JP | 2002-289859 A | 10/2002 |
| JP | 2002-538652 | 11/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-119672 A | 6/2011 |
| JP | 2011-129900 A | 6/2011 |
| WO | WO-00/51239 | 8/2000 |
| WO | WO-2004/114391 | 12/2004 |
| WO | WO-2011/052351 | 5/2011 |
| WO | WO-2011/062058 | 5/2011 |

OTHER PUBLICATIONS

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Matsuzaki.T et al., "1Mb Non-Volatile Random Access Memory Using Oxide Semiconductor", IMW 2011 (3rd IEEE International Memory Workshop), May 22, 2011, pp. 185-188.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn—Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Society of Applied Physics.

Godo.H et al., "P-9:Numerical Analysis on Temperature Dependence of Characteristics Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M, "Synthesis of Homologous Compound with New Long-Period Structure", NIRIM Newsletter, Mar. 1, 1995, vol. 150, pp. 1-4.
Nakamura.M et al., "The phase relations in the In2O3—Ga2ZnO4—ZnO system at 1350° C", Journal of Solid State Chemistry, Aug. 1, 1991, vol. 93, No. 2, pp. 298-315.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZNO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

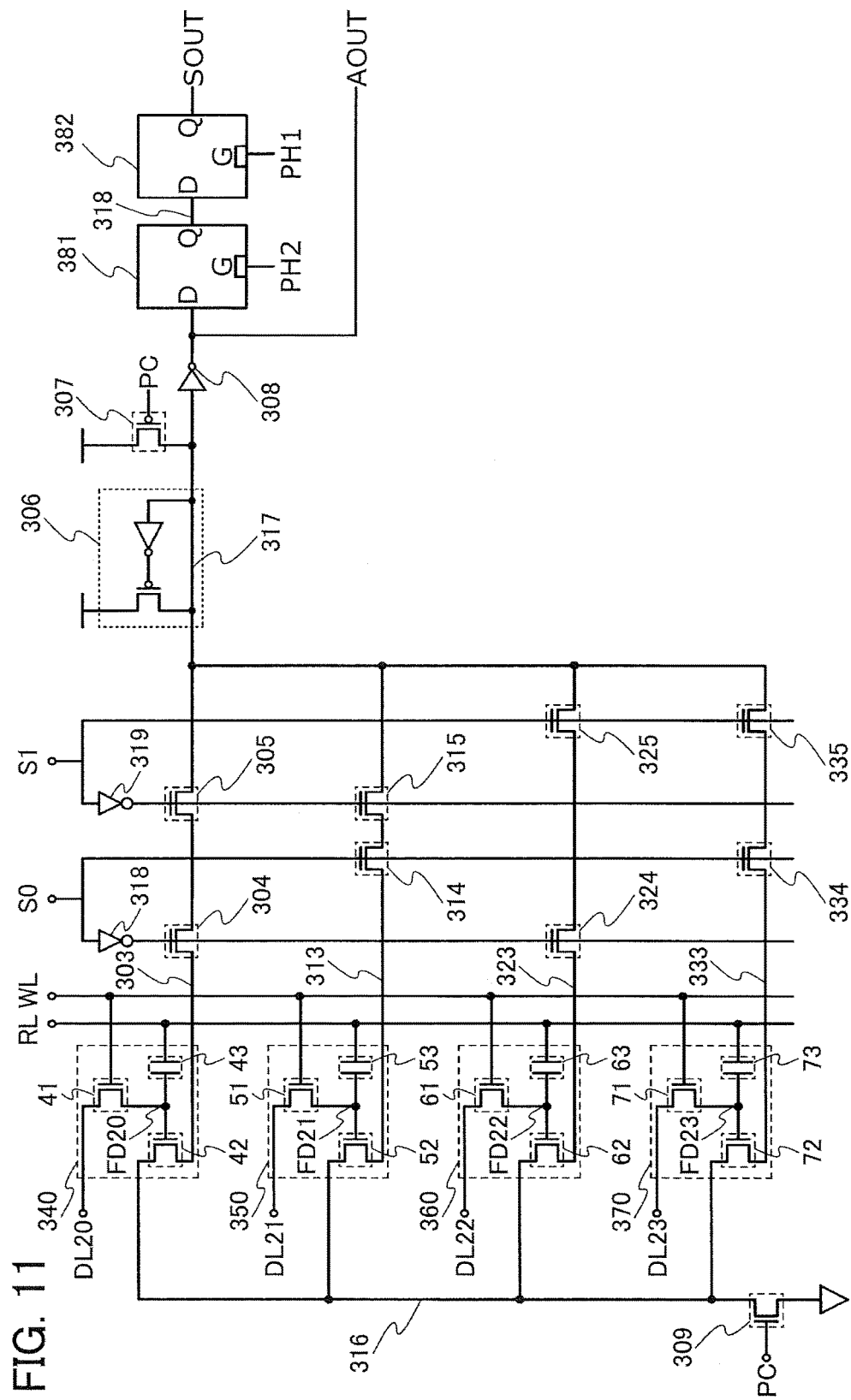

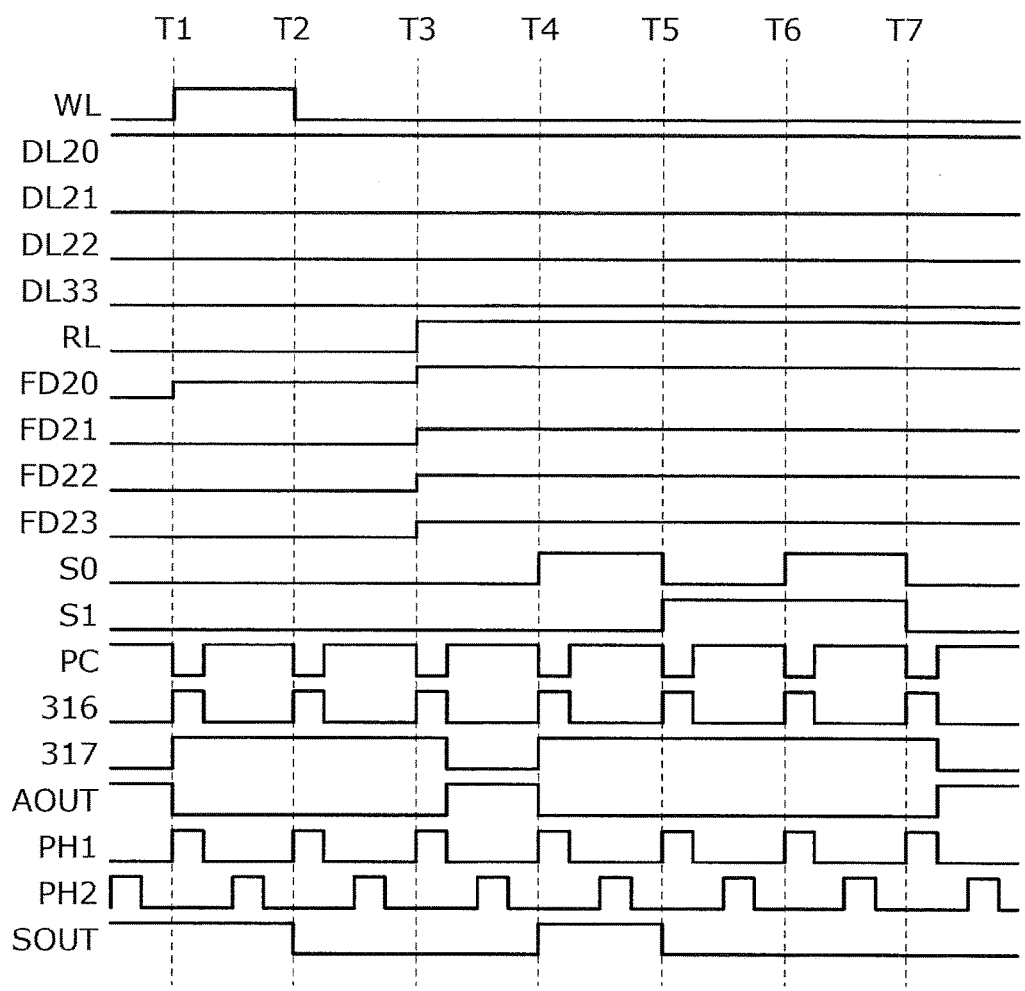

PROGRAMMABLE LOGIC DEVICE

CROSS-REFERENCE TO RELATED APPLICATIONS

This application is a continuation of U.S. application Ser. No. 14/684,492, filed Apr. 13, 2015, now allowed, which is a continuation of U.S. application Ser. No. 13/901,644, filed May 24, 2013, now U.S. Pat. No. 9,007,093, which claims the benefit of a foreign priority application filed in Japan as Serial No. 2012-123061 on May 30, 2012, all of which are incorporated by reference.

BACKGROUND OF THE INVENTION

1. Field of the Invention

The present invention relates to a programmable logic device in which the configuration of hardware can be changed.

2. Description of the Related Art

Unlike a normal integrated circuit in which all circuits are fixed at the time of manufacture, a programmable logic device (PLD) is a device that can function with an intended circuit structure set by a user at the time of actual use after shipment. Examples of such devices that are programmable by users are a small-scale programmable array logic (PAL) and generic array logic (GAL) and a large-scale complex programmable logic device (CPLD) and field programmable gate array (FPGA); in this specification, such devices are collectively called a programmable logic device (hereinafter referred to as PLD).

PLDs have advantages such as a short development period and flexibility in changing design specifications over conventional application specific integrated circuits (ASIC) and gate arrays. Thus, the use of PLDs for semiconductor devices has been promoted in recent years.

The PLD includes, for example, a plurality of logic elements (also referred to as logic blocks, and hereinafter referred to as LEs) arranged in an array and wirings between the LEs. A function of the PLD can be changed by changing a function of the LE. Moreover, a function of the PLD can be changed by changing a connection of wirings between the LEs.

The LE is composed of a multiplexer and a lookup table, for example. A function of the LE can be specified by setting a given value in a memory element that stores information on selection of signals input to the multiplexer. A function of the LE can be specified by setting a given value in a memory element that stores data of the lookup table.

The wirings between the LEs are constituted using, for example, a connection switch capable of controlling connections between plural LEs and plural LEs. The connection relation of the wirings between the LEs can be specified by setting a given value in a memory element that stores data on the on/off state of the connection switch.

The aforementioned information including the information on selection of signals input to a multiplexer, the data of a lookup table, and the data on the on/off state of a connection switch is referred to as configuration data, for example. A memory element storing configuration data is referred to as a configuration memory. Setting configuration data in a configuration memory is called "configuration". In particular, setting new configuration data (updating configuration data) in a configuration memory is called "reconfiguration". The circuit structure of the PLD can be changed into a circuit structure suitable for a user's request by producing (programming) desired configuration data and performing the configuration with the use of the configuration data.

REFERENCE

Patent Document

[Patent Document 1] Japanese Published Patent Application No. H10-285014

SUMMARY OF THE INVENTION

In the case where a static random access memory (SRAM) is used as a configuration memory, the area occupied by the configuration memory is extremely large because a large number of transistors are needed for the formation of the SRAM. In particular, the area occupied by the configuration memory is extremely large in a PLD having a function of what is called multicontext dynamic reconfiguration, on which a configuration memory capable of storing a plurality of sets of configuration data is mounted and in which one set of configuration data is rewritten into another set of configuration data in dynamic reconfiguration where configuration data is rewritten during operation of the PLD.

Patent Document 1 discloses, as a method for reducing the area occupied by a configuration memory in a PLD that is capable of dynamic reconfiguration, a method in which reconfiguration is performed in a short time in such a manner that pieces of configuration data corresponding to a plurality of circuit structures are stored at different addresses in a dynamic random access memory (DRAM), and configuration data for desired circuit structure is read from the address.

However, with the structure disclosed in Patent Document 1, regular refresh operation is required to store configuration data in the DRAM, and the power consumption is increased as a result. Since the DRAM is a volatile memory, it is necessary to store data in the DRAM every time the PLD is supplied with power. For this reason, a nonvolatile memory is additionally needed to store configuration data. In addition, a step of transferring a large volume of data from the nonvolatile memory to the DRAM is required every time the PLD is supplied with power; thus, the startup time is delayed.

In view of this, an object of one embodiment of the present invention is to provide a PLD in which a configuration memory is formed using a nonvolatile memory with a small number of transistors and in which the area of a region where the configuration memory is disposed is reduced.

Another object of one embodiment of the present invention is to provide a PLD that is easily capable of dynamic reconfiguration and has a short startup time.

In view of the above problems, one embodiment of the present invention can provide a PLD in which the area of a region where a configuration memory is disposed is reduced by using a nonvolatile memory with a small number of transistors per bit as the configuration memory, in which a plurality of pieces of configuration data can be easily stored, and which is capable of multicontext dynamic reconfiguration.

According to one embodiment of the present invention, a combinational circuit which includes a plurality of multiplexers and in which a two-phase-clocked flip-flop is provided in an LE and each of the multiplexers is controlled using one of the clock signals can be formed. With such a combinational circuit, a PLD with increased degree of flexibility in a circuit structure can be provided.

The nonvolatile memory stores data by controlling the amount of charge held in a memory through a transistor with an extremely small off-state current. With such a structure, charge can be held for a long time; thus, a nonvolatile memory in which the number of transistors is small can be formed.

Specifically, the transistor in the nonvolatile memory includes, in its channel formation region, a semiconductor material having a wider band gap and lower intrinsic carrier density than silicon. With a channel formation region including a semiconductor material having such physical properties, a transistor with an extremely small off-state current can be achieved. Examples of such a semiconductor material are an oxide semiconductor, silicon carbide, and gallium nitride, which have a band gap about three times as wide as that of silicon. A transistor including the above semiconductor material can have much lower off-state current than a transistor including a semiconductor material such as silicon or germanium.

One embodiment of the present invention is a programmable logic device including: a memory element; a selector; and an output portion. The memory element includes: a transistor in which a channel is formed in an oxide semiconductor film; and a storage capacitor and an inverter which are connected to one of a source and a drain of the transistor. The inverter is connected to the selector. The selector is connected to the output portion.

Another embodiment of the present invention is the programmable logic device in which a gate of the transistor is connected to a writing control line, and in which the other of the source and the drain of the transistor is connected to a writing data line.

Another embodiment of the present invention is a programmable logic device including: a plurality of memory elements arranged in an array; a selector; and an output portion. Each of the plurality of memory elements arranged in the array includes: a first transistor in which a channel is formed in an oxide semiconductor film; a storage capacitor and an inverter which are connected to one of a source and a drain of the first transistor; and a second transistor one of a source and a drain of which is connected to the inverter. The other of the source and the drain of the second transistor is connected to the selector. A gate of the second transistor is connected to a reading control line. The selector is connected to the output portion.

Another embodiment of the present invention is the programmable logic device in which a gate of the first transistor is connected to a writing control line, and in which the other of the source and the drain of the first transistor is connected to a writing data line.

Another embodiment of the present invention is a programmable logic device including: a memory element; a selector; a precharge circuit; and an output portion. The memory element includes: a first transistor in which a channel is formed in an oxide semiconductor film; and a second transistor a gate of which is connected to one of a source and a drain of the first transistor. One of a source and a drain of the second transistor is connected to the selector. The selector is connected to the precharge circuit and the output portion.

Another embodiment of the present invention is the programmable logic device, further including a latch circuit between the selector and the output portion.

Another embodiment of the present invention is the programmable logic device in which a gate of the first transistor is connected to a writing control line, and in which the other of the source and the drain of the first transistor is connected to a writing data line.

Another embodiment of the present invention is the programmable logic device, further including a storage capacitor connected to a node where the gate of the second transistor and the one of the source and the drain of the first transistor are connected to each other. The node is connected to a reading control line through the storage capacitor.

Another embodiment of the present invention is a programmable logic device including: a plurality of memory elements arranged in an array; a selector; a precharge circuit; and an output portion. Each of the plurality of memory elements arranged in the array includes: a first transistor in which a channel is formed in an oxide semiconductor film; a second transistor a gate of which is connected to one of a source and a drain of the first transistor; and a third transistor one of a source and a drain of which is connected to one of a source and a drain of the second transistor. The other of the source and the drain of the third transistor is connected to the selector. A gate of the third transistor is connected to a reading control line. The selector is connected to the precharge circuit and the output portion.

Another embodiment of the present invention is the programmable logic device, further including a latch circuit between the selector and the output portion.

Another embodiment of the present invention is the programmable logic device in which a gate of the first transistor is connected to a writing control line, and in which the other of the source and the drain of the first transistor is connected to a writing data line.

Another embodiment of the present invention is the programmable logic device, in which the selector includes a plurality of 1-bit selectors each including an input terminal, an inverter, and a transistor, and in which conduction between the memory element and the output portion depends on a conduction state of the transistor. The conduction state is determined by a signal input from the input terminal.

Another embodiment of the present invention is a programmable logic device including a plurality of logic elements arranged in an array. Each of the plurality of logic elements includes: a first transistor in which a channel is formed in an oxide semiconductor film; a node which is brought into an electrically floating state when the first transistor is turned off; a plurality of memory elements each including a second transistor in which conduction between a source and a drain depends on configuration data stored in the node; and a selector electrically connected to each of the plurality of memory elements. A predetermined logic circuit is set in the logic element depending on a conduction state of the second transistor and selection of any of the plurality of memory elements by the selector.

According to one embodiment of the present invention, a PLD in which a configuration memory is formed using a nonvolatile memory with a small number of transistors and in which the area of a region where the configuration memory is disposed is reduced can be provided.

Further, according to one embodiment of the present invention, a PLD that is easily capable of dynamic reconfiguration and has a short startup time can be provided.

BRIEF DESCRIPTION OF THE DRAWINGS

FIG. 11 is a circuit diagram illustrating an example of a PLD according to one embodiment of the present invention.

FIG. 12 is a timing chart of a PLD according to one embodiment of the present invention.

DETAILED DESCRIPTION OF THE INVENTION

Figure 1:
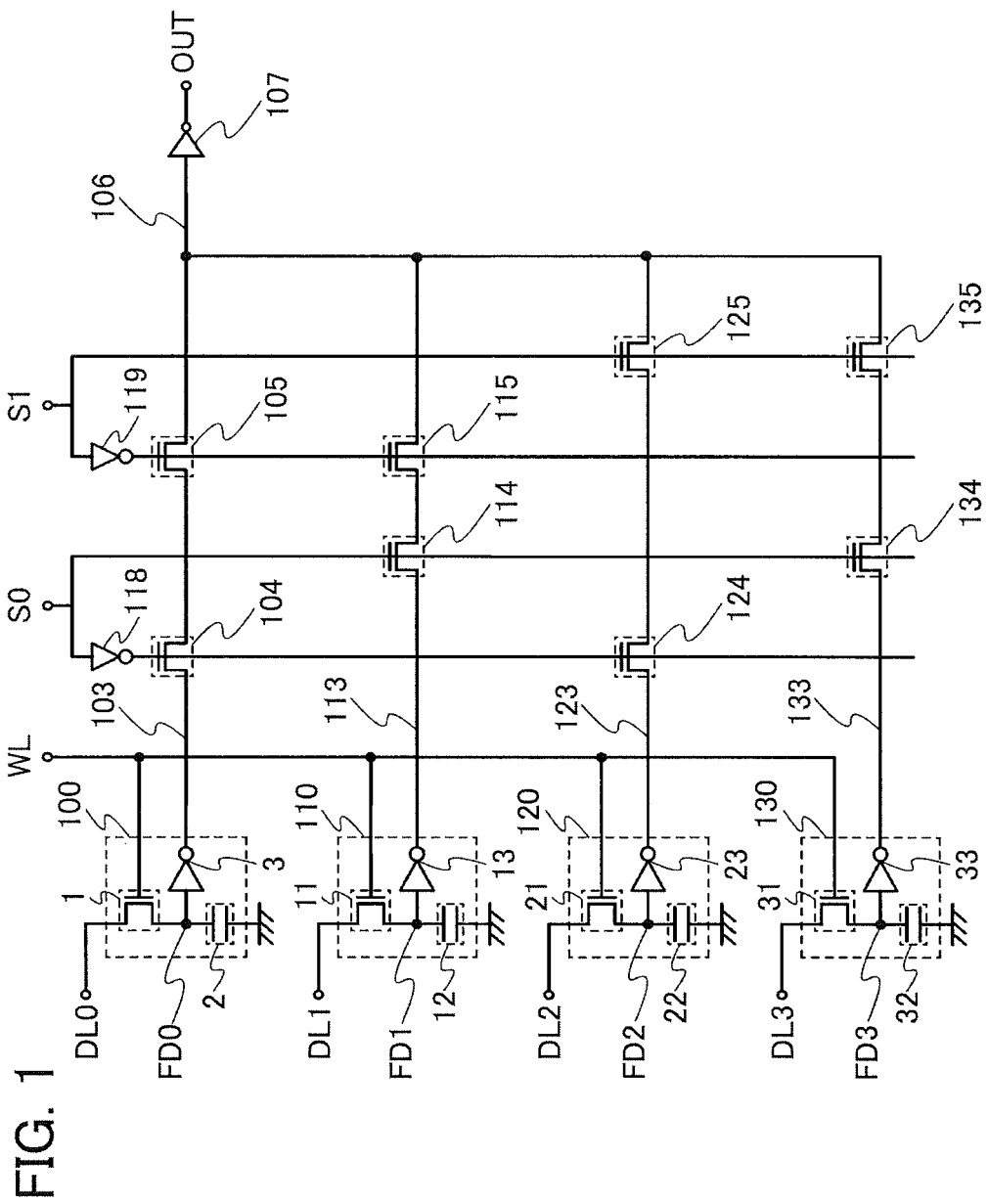
FIG. 1 is a circuit diagram illustrating an example of a PLD according to one embodiment of the present invention.

Embodiments and examples of the present invention will be described in detail with reference to the accompanying drawings. Note that the present invention is not limited to the following description and it is easily understood by those skilled in the art that the mode and details can be variously changed without departing from the scope and spirit of the present invention. Therefore, the present invention should not be construed as being limited to the description in the following embodiments. Note that in structures of the present invention described below, the same portions or portions having similar functions are denoted by the same reference numerals in different drawings, and description thereof is not repeated.

Note that, in each drawing in this specification, the size, the film thickness, or the region of each component is exaggerated for clarity in some cases. Therefore, embodiments of the present invention are not limited to such scales.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

Embodiment 1

In this embodiment, a PLD according to one embodiment of the present invention will be described with reference to FIG. 1 and FIG. 2.

(Structure)

FIG. 1 illustrates the structure of a multiplexer in an LE of a PLD. The multiplexer includes memory elements 100, 110, 120, and 130, transistors 104, 105, 114, 115, 124, 125, 134, and 135, and inverters 107, 118, and 119. The transistors 104, 105, 114, 115, 124, 125, 134, and 135 function as switches. These transistors, input terminals, and the inverters 118 and 119 form selectors. In FIG. 1, a 1-bit selector including the input terminal to which a signal S0 is input, the inverter 118, and the transistors 104, 114, 124, and 134, and a 1-bit selector including the input terminal to which a signal S1 is input, the inverter 119, and the transistors 105, 115, 125, and 135 are provided.

In FIG. 1, each of the memory elements 100, 110, 120, and 130 includes one transistor, one inverter, and one storage capacitor. That is, the memory element 100 includes a transistor 1 in which a channel is formed in an oxide semiconductor film, an inverter 3, and a storage capacitor 2; the memory element 110 includes a transistor 11 in which a channel is formed in an oxide semiconductor film, an inverter 13, and a storage capacitor 12; the memory element 120 includes a transistor 21 in which a channel is formed in an oxide semiconductor film, an inverter 23, and a storage capacitor 22; and the memory element 130 includes a transistor 31 in which a channel is formed in an oxide semiconductor film, an inverter 33, and a storage capacitor 32. A writing control line WL is set "H (High)", so that potentials corresponding to signals from writing data lines DL0, DL1, DL2, and DL3 can be held in storage capacitors FD0, FD1, FD2, and FD3 in the memory elements 100, 110, 120, and 130 respectively. The potentials of wirings 103, 113, 123, and 133 can be controlled depending on the potentials held in the storage capacitors FD0, FD1, FD2, and FD3 respectively.

When both the potentials of the signals S0 and S1 are "L (Low)", the wiring 103 and a wiring 106 are brought into conduction; when the potentials of the signals S0 and S1 are "H" and "L" respectively, the wiring 113 and the wiring 106 are brought into conduction; when the potentials of the signals S0 and S1 are "L" and "H" respectively, the wiring 123 and the wiring 106 are brought into conduction; and when both the potentials of the signals S0 and S1 are "H", the wiring 133 and the wiring 106 are brought into conduction.

In FIG. 1, the potential of an output signal OUT is "H" in the case where both the potentials of the signals S0 and S1 are "L" and the storage capacitor FD0 holds a potential corresponding to "H"; in the case where the potentials of the signals S0 and S1 are "H" and "L" respectively, and the storage capacitor FD1 holds a potential corresponding to "H"; in the case where the potentials of the signals S0 and S1 are "L" and "H" respectively, and the storage capacitor FD2 holds a potential corresponding to "H"; and in the case where both the potentials of the signals S0 and S1 are "H" and the storage capacitor FD3 holds a potential corresponding to "H". The potential of the output signal OUT is "L" in the other cases.

For example, when the storage capacitors FD0, FD1, FD2, and FD3 hold potentials corresponding to "H", "L", "L", and "L" respectively, the potential of the output signal OUT is "H" in the case where both the potentials of S0 and S1 are "L", and the potential of the output signal OUT is "L" in the other cases. That is, the multiplexer illustrated in FIG. 1 is a circuit equivalent to a NOR circuit in which S0 and S1 are inputs and OUT is an output. As another example, when the storage capacitors FD0, FD1, FD2, and FD3 hold potentials corresponding to "H", "H", "H", and "L" respectively, the potential of the output signal OUT is "L" in the case where both the potentials of S0 and S1 are "H", and the potential of the output signal OUT is "H" in the other cases. That is, the multiplexer illustrated in FIG. 1 is a circuit equivalent to a NAND circuit in which S0 and S1 are inputs and OUT is an output.

In this manner, the function of the multiplexer illustrated in FIG. 1 can be changed by changing the potentials stored in the memory elements 100, 110, 120, and 130. Further, the function of the LE including the multiplexer can be changed.

Although the multiplexer in which one output is obtained from the two inputs, S0 and S1, is described here, a multiplexer in which one output is obtained from three or more inputs may be employed. With such a structure, a configuration memory in which the number of transistors per bit is reduced can be formed. By forming a memory element using a transistor whose off-state current is extremely small, charge can be held for a long time and a nonvolatile memory can be easily achieved.

(Operation)

Figure 2:
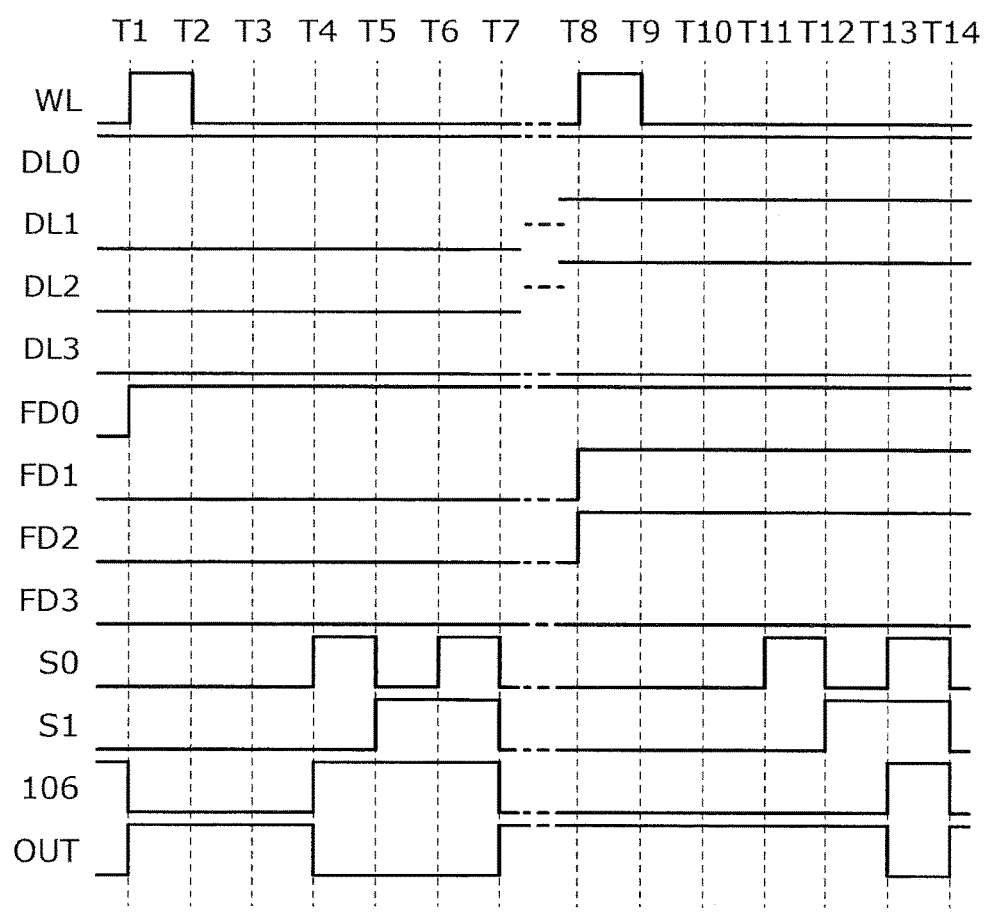
FIG. 2 is a timing chart of a PLD according to one embodiment of the present invention.

FIG. 2 is a timing chart showing an operation method of the multiplexer illustrated in FIG. 1.

Here, as one example, the potential of the writing control line WL is +V (corresponding to "H") or 0 (corresponding to "L"), the potential of each of the writing data lines DL0 to DL3 is +V (corresponding to "H") or 0 (corresponding to "L"), and the potential of the output signal OUT is +V (corresponding to "H") or 0 (corresponding to "L").

First, first writing of configuration data (between time T1 and time T2) will be described.

Between time T1 and time T2, WL is set "H", DL0 is set "H", DL1 is set "L", DL2 is set "L", and DL3 is set "L". At this time, the potential of FD0 becomes +V. That is, "H" is stored as configuration data, and "L" is output to the wiring 103. The potential of FD1 is 0, the potential of FD2 is 0, and the potential of FD3 is 0. That is, "L" is stored as configuration data, and "H" is output to the wirings 113, 123, and 133.

Between time T3 and time T4, both S0 and S1 are set "L", so that the transistors 104 and 105 are turned on; thus, the wirings 103 and 106 are brought into conduction. That is, the potential of the wiring 106 is "L". Therefore, the potential of the output signal OUT is "H".

Between time T4 and time T5, S0 and S1 are set "H" and "L" respectively, so that the transistors 114 and 115 are turned on; thus, the wirings 113 and 106 are brought into conduction. That is, the potential of the wiring 106 is "H". Therefore, the potential of the output signal OUT is "L".

Between time T5 and time T6, S0 and S1 are set "L" and "H" respectively, so that the transistors 124 and 125 are turned on; thus, the wirings 123 and 106 are brought into conduction. That is, the potential of the wiring 106 is "H". Therefore, the potential of the output signal OUT is "L".

Between time T6 and time T7, both S0 and S1 are set "H", so that the transistors 134 and 135 are turned on; thus, the wirings 133 and 106 are brought into conduction. That is, the potential of the wiring 106 is "H". Therefore, the potential of the output signal OUT is "L".

Thus, the multiplexer illustrated in FIG. 1 is a circuit equivalent to a NOR circuit in which S0 and S1 are inputs and OUT is an output by being driven in accordance with the timing chart of a PLD between time T1 and time T7 in FIG. 2.

Next, second writing of configuration data (between time T8 and time T9) will be described.

Between time T8 and time T9, WL is set "H", DL0 is set "H", DL1 is set "H", DL2 is set "H", and DL3 is set "L". At this time, the potential of FD0, the potential of FD1, and the potential of FD2 each become +V. That is, "H" is stored as configuration data, and "L" is output to the wiring 103, the wiring 113, and the wiring 123. The potential of FD3 is 0. That is, "L" is stored as configuration data, and "H" is output to the wiring 133.

Between time T10 and time T11, both S0 and S1 are set "L", so that the transistors 104 and 105 are turned on; thus, the wirings 103 and 106 are brought into conduction. That is, the potential of the wiring 106 is "L". Therefore, the potential of the output signal OUT is "H".

Between time T11 and time T12, S0 and S1 are set "H" and "L" respectively, so that the transistors 114 and 115 are turned on; thus, the wirings 113 and 106 are brought into conduction. That is, the potential of the wiring 106 is "L". Therefore, the potential of the output signal OUT is "H".

Between time T12 and time T13, S0 and S1 are set "L" and "H" respectively, so that the transistors 124 and 125 are turned on; thus, the wirings 123 and 106 are brought into conduction. That is, the potential of the wiring 106 is "L". Therefore, the potential of the output signal OUT is "H".

Between time T13 and time T14, both S0 and S1 are set "H", so that the transistors 134 and 135 are turned on; thus, the wirings 133 and 106 are brought into conduction. That is, the potential of the wiring 106 is "H". Therefore, the potential of the output signal OUT is "L".

Thus, by using the driving method in accordance with the timing chart of a PLD between time T8 and time T14 illustrated in FIG. 2, the multiplexer in FIG. 1 is a circuit equivalent to a NAND circuit in which S0 and S1 are inputs and OUT is an output.

Although the multiplexer in which one output is obtained from the two inputs, S0 and S1, is described here, a multiplexer in which one output is obtained from three or more inputs may be employed.

With such a structure, a PLD including a configuration memory in which the number of transistors per bit is reduced can be made to operate. Further, by forming a memory element using a transistor whose off-state current is extremely small, a nonvolatile memory can be easily achieved. Furthermore, a PLD including the nonvolatile memory can be made to operate.

This embodiment can be implemented in appropriate combination with any of the other embodiments.

Embodiment 2

Next, a PLD including a memory element having a structure different from that in Embodiment 1 according to one embodiment of the present invention will be described with reference to FIG. 3 and FIG. 4.

(Structure)

Figure 3:
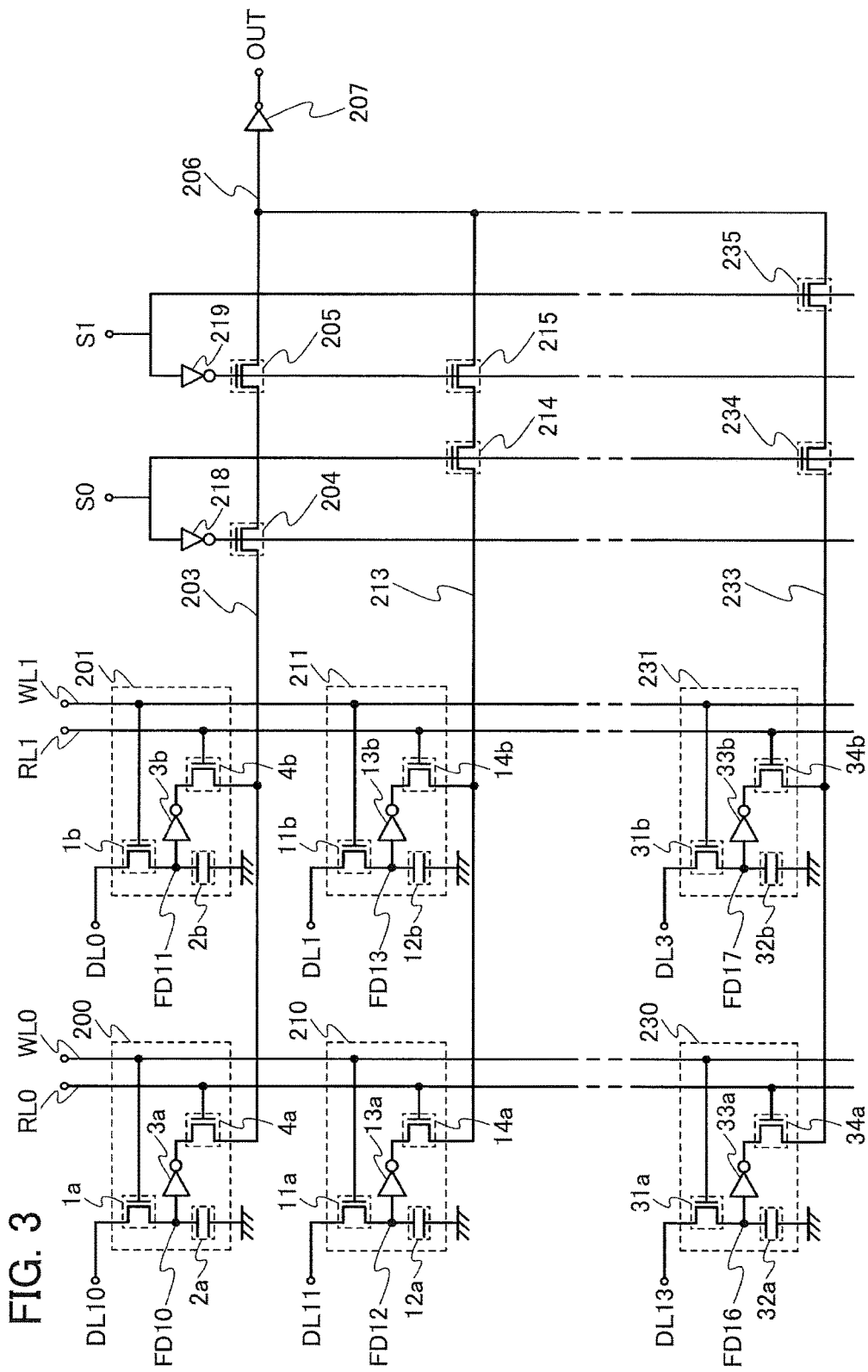
FIG. 3 is a circuit diagram illustrating an example of a PLD according to one embodiment of the present invention.

FIG. 3 illustrates the structure of a multiplexer in an LE of a PLD, which is different from the structure in FIG. 1. The multiplexer includes memory elements 200, 201, 210, 211, 220 (not shown), 221 (not shown), 230, and 231, transistors 204, 205, 214, 215, 224 (not shown), 225 (not shown), 234, and 235, and inverters 207, 218, and 219. The transistors 204, 205, 214, 215, 224, 225, 234, and 235 function as switches. These transistors, input terminals, and the inverters 218 and 219 form selectors. In FIG. 3, a 1-bit selector including the input terminal to which a signal S0 is input, the inverter 218, and the transistors 204, 214, 224, and 234, and a 1-bit selector including the input terminal to which a signal S1 is input, the inverter 219, and the transistors 205, 215, 225, and 235 are provided.

In FIG. 3, each of the memory elements 200, 201, 210, 211, 220, 221, 230, and 231 includes two transistors, one inverter, and one storage capacitor. That is, the memory element 200 includes a transistor 1a in which a channel is formed in an oxide semiconductor film, an inverter 3a, a storage capacitor 2a, and a transistor 4a; the memory element 201 includes a transistor 1b in which a channel is formed in an oxide semiconductor film, an inverter 3b, a storage capacitor 2b, and a transistor 4b; the memory element 210 includes a transistor 11a in which a channel is formed in an oxide semiconductor film, an inverter 13a, a storage capacitor 12a, and a transistor 14a; the memory element 211 includes a transistor 11b in which a channel is formed in an oxide semiconductor film, an inverter 13b, a storage capacitor 12b, and a transistor 14b; the memory element 230 includes a transistor 31a in which a channel is formed in an oxide semiconductor film, an inverter 33a, a storage capacitor 32a, and a transistor 34a; and the memory element 231 includes a transistor 31b in which a channel is formed in an oxide semiconductor film, an inverter 33b, a storage capacitor 32b, and a transistor 34b. A writing control line WL0 (WL1) is set "H", so that potentials corresponding to signals from writing data lines DL10 (DL0), DL11 (DL1), DL12 (DL2), and DL13 (DL3) can be held in storage capacitors FD10 (FD11), FD12 (FD13), FD14 (FD15), and FD16 (FD17) in the memory elements 200 (201), 210 (211), 220 (221), and 230 (231) respectively. A reading control line RL0 (RL1) is set "H", whereby the potentials of wirings 203, 213, 223 (not shown), and 233 can be controlled depending on the potentials held in the storage capacitors FD10 (FD11), FD12 (FD13), FD14 (FD15), and FD16 (FD17) respectively.

When both the potentials of the signals S0 and S1 are "L", the wiring 203 and a wiring 206 are brought into conduction; when the potentials of the signals S0 and S1 are "H" and "L" respectively, the wiring 213 and the wiring 206 are brought into conduction; when the potentials of the signals S0 and S1 are "L" and "H" respectively, the wiring 223 and the wiring 206 are brought into conduction; and when both the potentials of the signals S0 and S1 are "H", the wiring 233 and the wiring 206 are brought into conduction.

In FIG. 3, when the reading control line RL0 is set "H", the potential of an output signal OUT is "H" in the case where both the potentials of the signals S0 and S1 are "L" and the storage capacitor FD10 holds a potential corresponding to "H"; in the case where the potentials of the signals S0 and S1 are "H" and "L" respectively, and the storage capacitor FD12 holds a potential corresponding to "H"; in the case where the potentials of the signals S0 and S1 are "L" and "H" respectively, and the storage capacitor FD14 holds a potential corresponding to "H"; and in the case where both the potentials of the signals S0 and S1 are "H" and the storage capacitor FD16 holds a potential corresponding to "H". The potential of the output signal OUT is "L" in the other cases.

In a similar manner, in FIG. 3, when the reading control line RL1 is set "H", the potential of the output signal OUT is "H" in the case where both the potentials of the signals S0 and S1 are "L" and the storage capacitor FD11 holds a potential corresponding to "H"; in the case where the potentials of the signals S0 and S1 are "H" and "L" respectively, and the storage capacitor FD13 holds a potential corresponding to "H"; in the case where the potentials of the signals S0 and S1 are "L" and "H" respectively, and the storage capacitor FD15 holds a potential corresponding to "H"; and in the case where both the potentials of the signals S0 and S1 are "H" and the storage capacitor FD17 holds a potential corresponding to "H". The potential of the output signal OUT is "L" in the other cases.

For example, the case where the storage capacitors FD10, FD12, FD14, and FD16 hold potentials corresponding to "H", "L", "L", and "L" respectively, and the storage capacitors FD11, FD13, FD15, and FD17 hold potentials corresponding to "H", "H", "H", and "L" respectively is described.

When the reading control line RL0 is set "H", the potential of the output signal OUT is "H" in the case where both the potentials of S0 and S1 are "L", and the potential of the output signal OUT is "L" in the other cases. That is, the multiplexer illustrated in FIG. 3 is a circuit equivalent to a NOR circuit in which S0 and S1 are inputs and OUT is an output.

When the reading control line RL1 is set "H", the potential of the output signal OUT is "L" in the case where both the potentials of S0 and S1 are "H", and the potential of the output signal OUT is "H" in the other cases. That is, the multiplexer illustrated in FIG. 3 is a circuit equivalent to a NAND circuit in which S0 and S1 are inputs and OUT is an output.

In this manner, the function of the multiplexer illustrated in FIG. 3 can be changed by changing the potentials stored in the memory elements 200, 201, 210, 211, 220, 221, 230, and 231. Further, the function of the LE including the multiplexer can be changed. In particular, controlling the reading control lines RL0 and RL1 can change the function of the multiplexer immediately.

Although the multiplexer in which one output is obtained from the two inputs, S0 and S1, is described here, a multiplexer in which one output is obtained from three or more inputs may be employed.

With such a structure, a configuration memory in which the number of transistors per bit is reduced can be formed. By forming a memory element using a transistor whose off-state current is extremely small as at least a transistor that supplies a potential to a storage capacitor, a nonvolatile memory can be easily achieved. Further, a plurality of pieces of configuration data can be stored and switching of the configuration data can be performed by selecting either the reading control line RL0 or the reading control line RL1; thus, the time required for reading can be shortened. Accordingly, switching of the configuration data can be performed in a short time. Although a structure in which two sets of configuration data are stored is described here, a structure in which three or more sets of configuration data are stored may be employed.

With such a structure, the area of a region where the configuration memory is disposed can be reduced, and a plurality of sets of configuration data can be stored. Accordingly, a PLD that is easily capable of dynamic reconfiguration can be provided.

(Operation)

Figure 4:
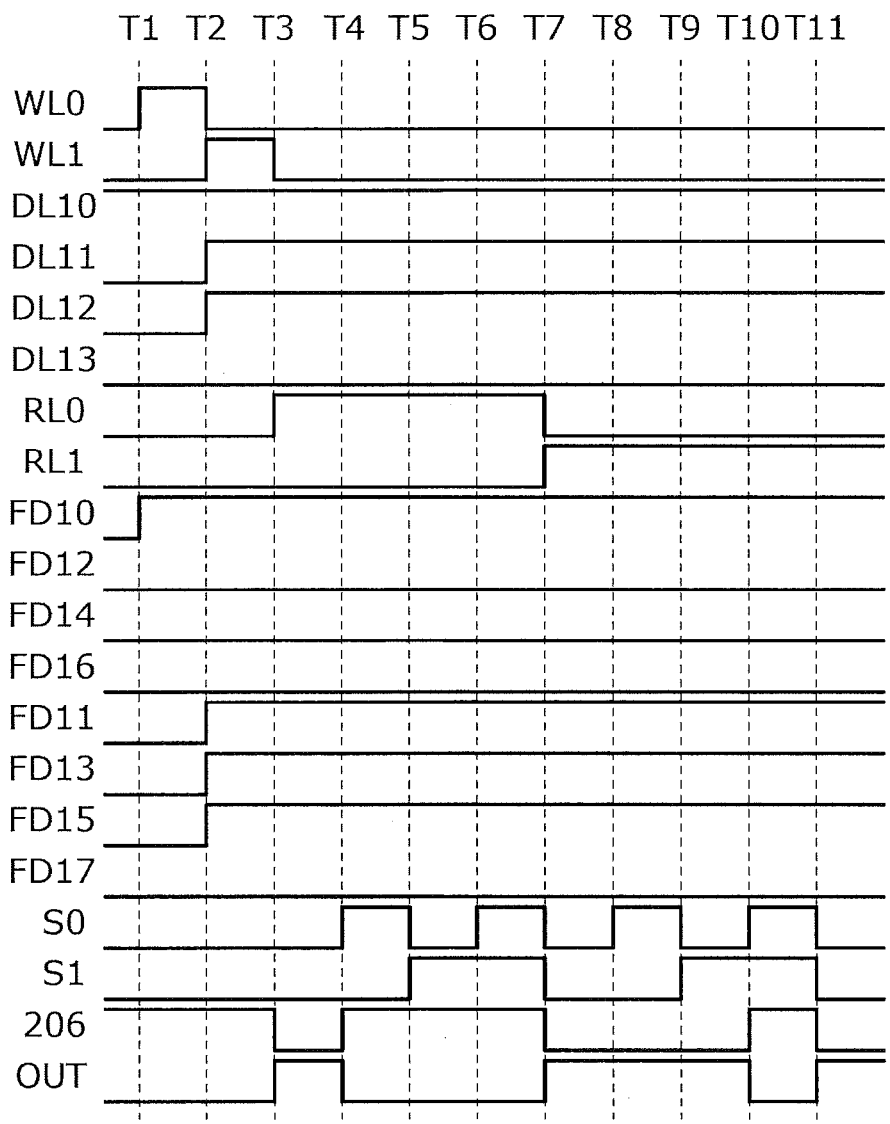
FIG. 4 is a timing chart of a PLD according to one embodiment of the present invention.

FIG. 4 is a timing chart showing an operation method of the multiplexer illustrated in FIG. 3.

First, first writing of configuration data (between time T1 and time T2) will be described.

Between time T1 and time T2, WL0 is set "H", WL1 is set "L", RL0 is set "L", RL1 is set "L", DL10 is set "H", DL11 is set "L", DL12 is set "L", and DL13 is set "L". The potentials of DL0 to DL3 are "L" (not shown). At this time, the potential of FD10 becomes +V. That is, "H" is stored as configuration data. The potential of FD12 is 0, the potential of FD14 is 0, and the potential of FD16 is 0. That is, "L" is stored as configuration data.

Next, second writing of configuration data (between time T2 and time T3) will be described.

Between time T2 and time T3, WL0 is set "L", WL1 is set "H", RL0 is set "L", RL1 is set "L", DL10 is set "H", DL11 is set "H", DL12 is set "H", and DL13 is set "L". At this time, the potential of FD11 becomes +V, the potential of FD13 becomes +V, and potential of FD15 becomes +V. That is, "H" is stored as configuration data. The potential of FD17 is 0. That is, "L" is stored as configuration data.

Next, first switching of configuration data (between time T3 and time T7) will be described.

At time T3, RL0 and RL1 are set "H" and "L" respectively. At this time, the potential of the wiring 203 becomes "L", and the potentials of the wirings 213, 223, and 233 become "H".

At time T3, both S0 and S1 are set "L", so that the transistors 204 and 205 are turned on; thus, the wirings 203 and 206 are brought into conduction. That is, the potential of the wiring 206 is "L". Therefore, the potential of the output signal OUT is "H".

At time T4, S0 and S1 are set "H" and "L" respectively, so that the transistors 214 and 215 are turned on; thus, the wirings 213 and 206 are brought into conduction. That is, the potential of the wiring 206 is "H". Therefore, the potential of the output signal OUT is "L".

At time T5, S0 and S1 are set "L" and "H" respectively, so that the transistors 224 and 225 are turned on; thus, the wirings 223 and 206 are brought into conduction. That is, the potential of the wiring 206 is "H". Therefore, the potential of the output signal OUT is "L".

At time T6, both S0 and S1 are set "H", so that the transistors 234 and 235 are turned on; thus, the wirings 233 and 206 are brought into conduction. That is, the potential of the wiring 206 is "H". Therefore, the potential of the output signal OUT is "L".

That is, by using the driving method in accordance with the timing chart of a PLD between time T1 and time T7 illustrated in FIG. 4, the multiplexer illustrated in FIG. 3 is a circuit equivalent to a NOR circuit in which S0 and S1 are inputs and OUT is an output.

Next, second switching of configuration data (between time T7 and time T11) will be described.

At time T7, RL0 and RL1 are set "L" and "H" respectively. At this time, the potentials of the wirings 203, 213, and 223 become "L", and the potential of the wiring 233 becomes "H".

At time T7, both S0 and S1 are set "L", so that the transistors 204 and 205 are turned on; thus, the wirings 203 and 206 are brought into conduction. That is, the potential of the wiring 206 is "L". Therefore, the potential of the output signal OUT is "H".

At time T8, S0 and S1 are set "H" and "L" respectively, so that the transistors 214 and 215 are turned on; thus, the wirings 213 and 206 are brought into conduction. That is, the potential of the wiring 206 is "L". Therefore, the potential of the output signal OUT is "H".

At time T9, S0 and S1 are set "L" and "H" respectively, so that the transistors 224 and 225 are turned on; thus, the wirings 223 and 206 are brought into conduction. That is, the potential of the wiring 206 is "L". Therefore, the potential of the output signal OUT is "H".

At time T10, both S0 and S1 are set "H", so that the transistors 234 and 235 are turned on; thus, the wirings 233 and 206 are brought into conduction. That is, the potential of the wiring 206 is "H". Therefore, the potential of the output signal OUT is "L".

That is, by using the driving method in accordance with the timing chart of a PLD between time T7 and time T11 illustrated in FIG. 4, the multiplexer illustrated in FIG. 3 is a circuit equivalent to a NAND circuit in which S0 and S1 are inputs and OUT is an output.

Although the multiplexer in which one output is obtained from the two inputs, S0 and S1, is described here, a multiplexer in which one output is obtained from three or more inputs may be employed.

In the structure described here, both RL0 and RL1 are set "L" at the time of changing configuration data, that is, configuration data is changed while the operation of the PLD is stopped; however, during the operation in accordance with one set of configuration data, another set of configuration data may be changed. In other words, in a period during which the PLD operates in accordance with configuration data stored in FD10, FD12, FD14, and FD16 by setting RL0 and RL1 "H" and "L" respectively, configuration data stored in FD11, FD13, FD15, and FD17 can be changed by setting WL0 and WL1 "L" and "H" respectively.

Although a structure in which two sets of configuration data are stored in a memory element and are switched is described here, a structure in which three or more sets of configuration data are stored in a memory element and are switched may be employed. During the operation in accordance with one set of configuration data among the three or more sets of configuration data, another set of configuration data can be changed.

With such a structure, a PLD which includes a configuration memory in which the number of transistors per bit is reduced can be made to operate. Further, by forming a memory element using a transistor whose off-state current is extremely small as at least a transistor that supplies a potential to a storage capacitor, a nonvolatile memory can be easily achieved. A PLD in which the nonvolatile memory is used as a configuration memory can be made to operate. Furthermore, the area of a region where the configuration memory is disposed can be easily reduced. Accordingly, a plurality of pieces of configuration data can be stored, and dynamic reconfiguration of a PLD can be performed in a short time.

This embodiment can be implemented in an appropriate combination with any of the other embodiments.

Embodiment 3

Next, a PLD including a memory element having a structure different from those in Embodiments 1 and 2 according to one embodiment of the present invention will be described with reference to FIG. 5 and FIG. 6. That is, this embodiment is different from Embodiments 1 and 2 in that a dynamic memory element including a capacitor and a reading control line is used instead of a static memory element including an inverter (CMOS circuit).

(Structure)

Figure 5:
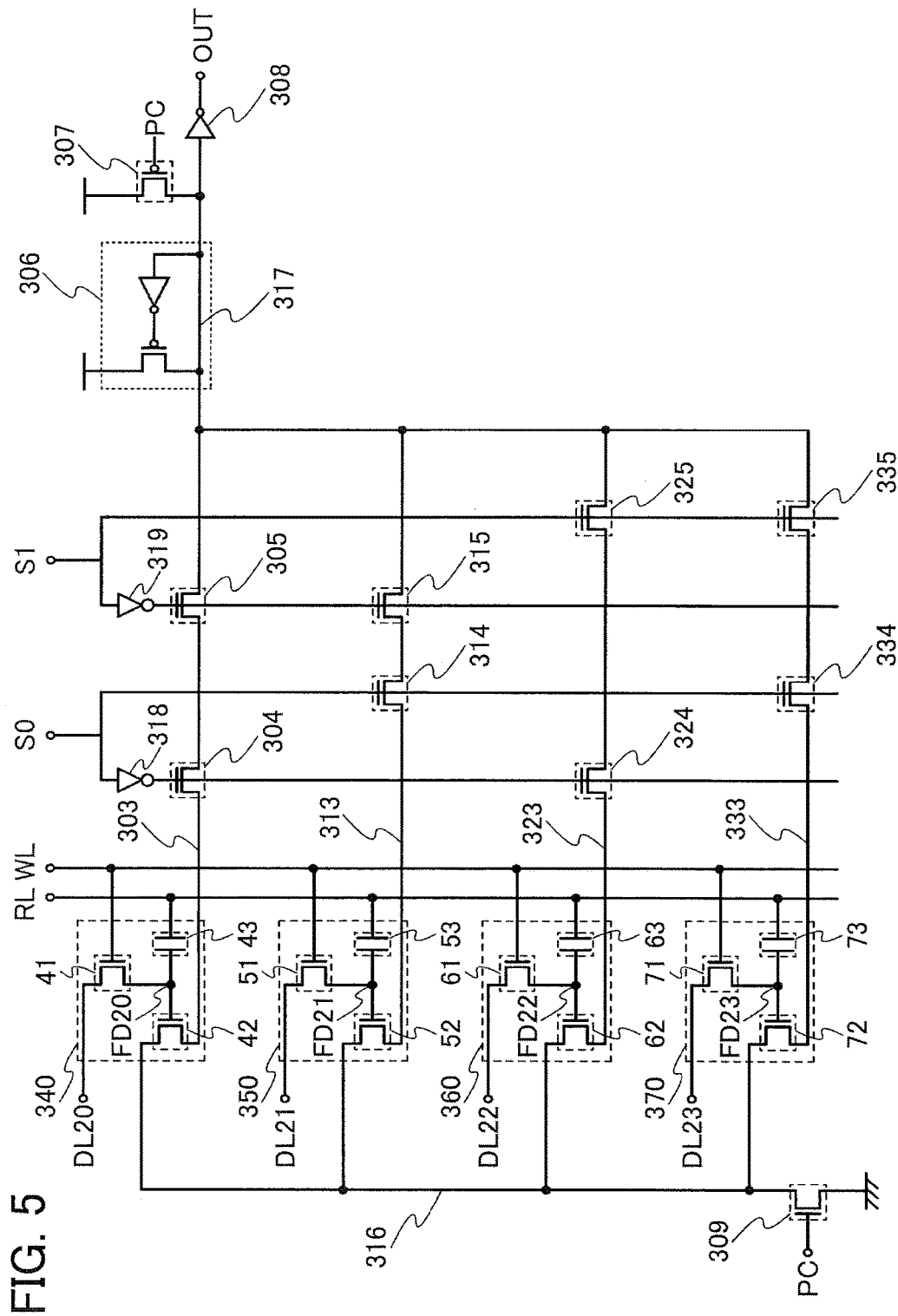
FIG. 5 is a circuit diagram illustrating an example of a PLD according to one embodiment of the present invention.

FIG. 5 illustrates the structure of a multiplexer in an LE of a PLD. The multiplexer includes memory elements 340, 350, 360, and 370, transistors 304, 305, 314, 315, 324, 325, 334, and 335, a latch circuit 306, a transistor 307, inverters 308, 318, and 319, and a transistor 309. The transistors 304, 305, 314, 315, 324, 325, 334, and 335 function as switches. These transistors, input terminals, and the inverters 318 and 319 form selectors. In FIG. 5, a 1-bit selector including the input terminal to which a signal S0 is input, the inverter 318, and the transistors 304, 314, 324, and 334, and a 1-bit selector including the input terminal to which a signal S1 is input, the inverter 319, and the transistors 305, 315, 325, and 335 are provided.

Although the latch circuit 306 is provided in the multiplexer of this embodiment, the latch circuit 306 is not necessarily provided.

In FIG. 5, each of the memory elements 340, 350, 360, and 370 includes two transistors and one storage capacitor. That is, the memory element 340 includes a transistor 41 in which a channel is formed in an oxide semiconductor film, a storage capacitor 43, and a transistor 42; the memory element 350 includes a transistor 51 in which a channel is formed in an oxide semiconductor film, a storage capacitor 53, and a transistor 52; the memory element 360 includes a transistor 61 in which a channel is formed in an oxide semiconductor film, a storage capacitor 63, and a transistor 62; and the memory element 370 includes a transistor 71 in which a channel is formed in an oxide semiconductor film, a storage capacitor 73, and a transistor 72. A writing control line WL is set "H", so that potentials corresponding to signals from writing data lines DL20, DL21, DL22, and DL23 can be held in the storage capacitors FD20, FD21, FD22, and FD23 in the memory elements 340, 350, 360, and 370 respectively. A reading control line RL is set "H", so that electrical conduction between a wiring 316 and wirings 303, 313, 323, and 333 can be controlled depending on the potentials held in the storage capacitors FD20, FD21, FD22, and FD23 in the memory elements 340, 350, 360, and 370 respectively.

When both the potentials of the signals S0 and S1 are "L", the wiring 303 and a wiring 317 are brought into conduction; when the potentials of the signals S0 and S1 are "H" and "L" respectively, the wiring 313 and the wiring 317 are brought into conduction; when the potentials of the signals S0 and S1 are "L" and "H" respectively, the wiring 323 and the wiring 317 are brought into conduction; and when both the potentials of the signals S0 and S1 are "H", the wiring 333 and the wiring 317 are brought into conduction.

In FIG. 5, when the reading control line RL is set "H" after PC (pre-charge) is set "L" once and then set "H", the potential of an output signal OUT is "H" in the case where both the potentials of the signals S0 and S1 are "L" and the storage capacitor FD20 holds a potential corresponding to "H"; in the case where the potentials of the signals S0 and S1 are "H" and "L" respectively, and the storage capacitor FD21 holds a potential corresponding to "H"; in the case where the potentials of the signals S0 and S1 are "L" and "H" respectively, and the storage capacitor FD22 holds a potential corresponding to "H"; and in the case where both the potentials of the signals S0 and S1 are "H" and the storage capacitor FD23 holds a potential corresponding to "H". The potential of the output signal OUT is "L" in the other cases.

For example, when the storage capacitors FD20, FD21, FD22, and FD23 hold potentials corresponding to "H", "L", "L", and "L" respectively, the potential of the output signal OUT is "H" in the case where both the potentials of S0 and S1 are "L", and the potential of the output signal OUT is "L" in the other cases. That is, the multiplexer illustrated in FIG. 5 is a circuit equivalent to a NOR circuit in which S0 and S1 are inputs and OUT is an output. As another example, when the storage capacitors FD20, FD21, FD22, and FD23 hold potentials corresponding to "H", "H", "H", and "L" respectively, the potential of the output signal OUT is "L" in the case where both the potentials of S0 and S1 are "H", and the potential of the output signal OUT is "H" in the other cases.

That is, the multiplexer illustrated in FIG. 5 is a circuit equivalent to a NAND circuit in which S0 and S1 are inputs and OUT is an output.

In this manner, the function of the multiplexer illustrated in FIG. 5 can be changed by changing the potentials stored in the memory elements 340, 350, 360, and 370. Further, the function of the LE including the multiplexer can be changed.

Although the multiplexer in which one output is obtained from the two inputs, S0 and S1, is described here, a multiplexer in which one output is obtained from three or more inputs may be employed.

With such a structure, a configuration memory in which the number of transistors per bit is reduced can be formed. Further, by forming a memory element using a transistor whose off-state current is extremely small as at least a transistor that supplies a potential to a storage capacitor, a nonvolatile memory can be easily achieved.

(Operation)

Figure 6:
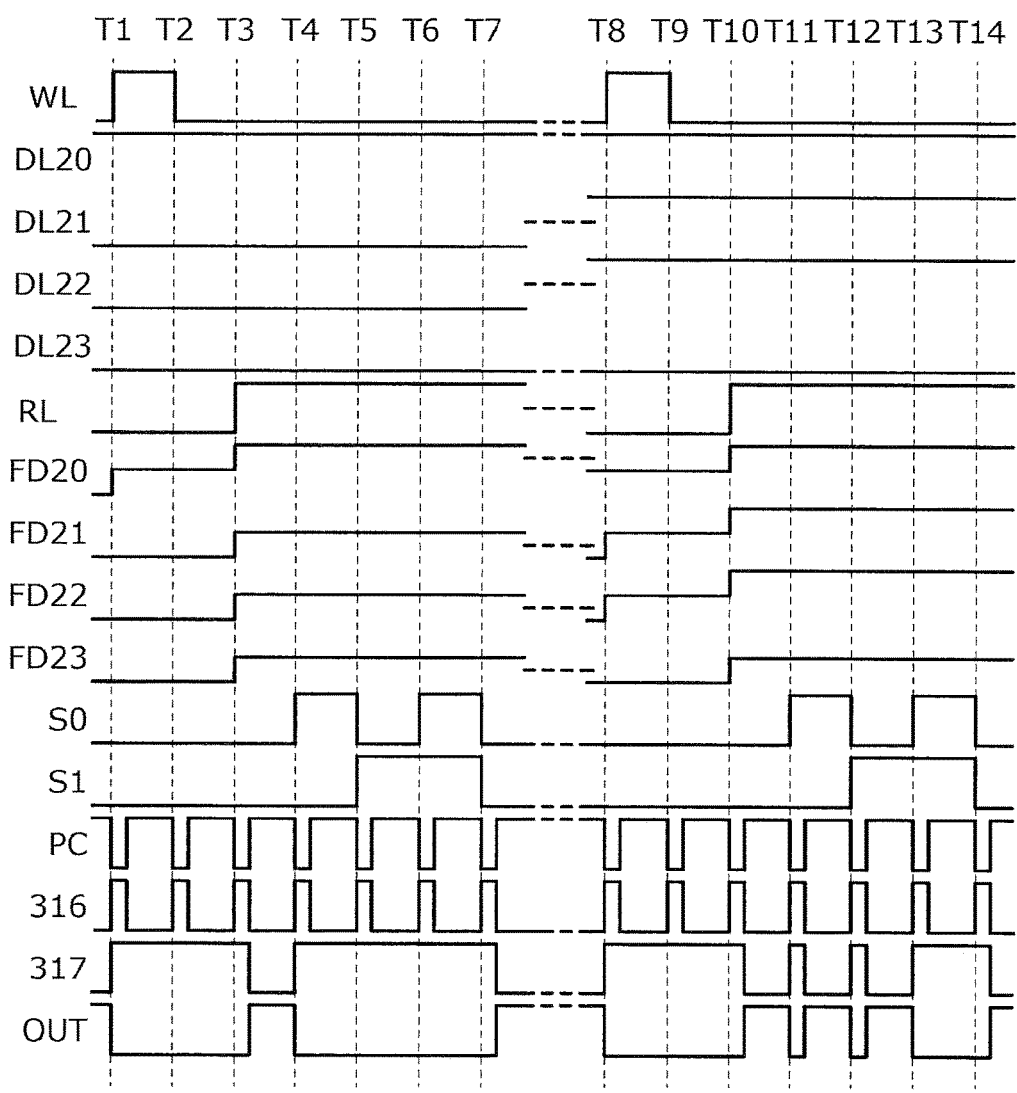
FIG. 6 is a timing chart of a PLD according to one embodiment of the present invention.

FIG. 6 is a timing chart showing an operation method of the multiplexer illustrated in FIG. 5.

Here, as one example, the potential of the writing control line WL is +V (corresponding to "H") or −V (corresponding to "L"), the potential of the reading control line RL is +V (corresponding to "H") or 0 (corresponding to "L"), the potential of each of the writing data lines DL20 to DL23 is 0 (corresponding to "H") or −V (corresponding to "L"), and the potential of each of the wirings 316 and 317 and the output signal OUT is +V (corresponding to "H") or 0 (corresponding to "L").

First, first writing of configuration data (between time T1 and time T2) will be described.

Between time T1 and time T2, WL is set "H", RL is set "L", DL20 is set "H", DL21 is set "L", DL22 is set "L", and DL23 is set "L". At this time, the potential of FD20 becomes 0, which corresponds to a potential at which the switches are turned on. That is, "H" is stored as configuration data. The potential of FD21, the potential of FD22, and the potential of FD23 each become −V, which corresponds to a potential at which the switches are turned off. That is, "L" is stored as configuration data.

It is preferable that the potential of PC be continuously "L" and the potential of the wiring 317 be kept at "H" in the first writing of configuration data. With such a structure, power consumed during writing of configuration data can be reduced. Further, the wiring 317 is preferably provided with the latch circuit 306. With this structure, the potential of the wiring 317 can be prevented from being a floating potential even when PC is always set "H", and generation of excessive current in the inverter 308 to which the potential of the wiring 317 is input as an input potential can be prevented.

Next, first switching of configuration data (between time T3 and time T7) will be described.

At time T3, RL is set "H". At this time, the memory element 340 is brought into conduction, and the memory elements 350, 360, and 370 are brought out of conduction. Accordingly, the wiring 316 and the wiring 303 are brought into conduction, and the wiring 316 and the wirings 313, 323, and 333 are brought out of conduction.

At time T3, S0 and S1 are set "L". PC is set "L" for a short time after time T3, and then is set "H". Since the transistors 304 and 305 are turned on when PC is set "H", the wiring 303 and the wiring 317 are brought into conduction. That is, the wiring 316 and the wiring 317 are brought into conduction, and the potential of the wiring 317 becomes "L". Accordingly, the potential of the output signal OUT becomes "H".

At time T4, S0 and S1 are set "H" and "L" respectively. PC is set "L" for a short time after time T4, and then is set "H". Since the transistors 314 and 315 are turned on when PC is set "H", the wiring 313 and the wiring 317 are brought into conduction. However, the wiring 316 and the wiring 313 are out of conduction, and thus the wiring 317 remains "H". Accordingly, the potential of the output signal OUT becomes "L".

At time T5, S0 and S1 are set "L" and "H" respectively. PC is set "L" for a short time after time T5, and then is set "H". Since the transistors 324 and 325 are turned on when PC is set "H", the wiring 323 and the wiring 317 are brought into conduction. However, the wiring 316 and the wiring 323 are out of conduction, and thus the wiring 317 remains "H". Accordingly, the potential of the output signal OUT becomes "L".

At time T6, S0 and S1 are set "H". PC is set "L" for a short time after time T6, and then is set "H". Since the transistors 334 and 335 are turned on when PC is set "H", the wiring 333 and the wiring 317 are brought into conduction. However, the wiring 316 and the wiring 333 are out of conduction, and thus the wiring 317 remains "H". Accordingly, the potential of the output signal OUT becomes "L".

That is, by using the driving method in accordance with the timing chart of a PLD between time T1 and time T7 illustrated in FIG. 6, the multiplexer illustrated in FIG. 5 is a circuit equivalent to a NOR circuit in which S0 and S1 are inputs and OUT is an output.

Next, second writing of configuration data (between time T8 and time T9) will be described.

Between time T8 and time T9, WL is set "H", RL is set "L", DL20 is set "H", DL21 is set "H", DL22 is set "H", and DL23 is set "L". At this time, the potential of FD20, the potential of FD21, and the potential of FD22 each become 0, which corresponds to a potential at which the switches are turned on. That is, "H" is stored as configuration data. The potential of FD23 becomes −V, which corresponds to a potential at which the switches are turned off. That is, "L" is stored as configuration data.

It is preferable that the potential of PC be continuously "L" and the potential of the wiring 317 be kept at "H" in the second writing of configuration data. With such a structure, power consumed during writing of configuration data can be reduced. Further, the wiring 317 is preferably provided with the latch circuit 306. With this structure, the potential of the wiring 317 can be prevented from being a floating potential even when PC is always set "H", and generation of excessive current in the inverter 308 to which the potential of the wiring 317 is input as an input potential can be prevented.

Next, second switching of configuration data (between time T10 and time T14) will be described.

At time T10, RL is set "H". At this time, the memory elements 340, 350, and 360 are brought into conduction, and the memory element 370 is brought out of conduction. Accordingly, the wiring 316 and the wirings 303, 313, and 323 are brought into conduction, and the wiring 316 and the wiring 333 are brought out of conduction.

At time T10, S0 and S1 are set "L". PC is set "L" for a short time after time T10, and then is set "H". Since the transistors 304 and 305 are turned on when PC is set "H", the wiring 303 and the wiring 317 are brought into conduction. That is, the wiring 316 and the wiring 317 are brought into conduction, and the potential of the wiring 317 becomes "L". Accordingly, the potential of the output signal OUT becomes "H".

At time T11, S0 and S1 are set "H" and "L" respectively. PC is set "L" for a short time after time T11, and then is set "H". Since the transistors 314 and 315 are turned on when PC is set "H", the wiring 313 and the wiring 317 are brought into conduction. That is, the wiring 316 and the wiring 317 are brought into conduction, and the potential of the wiring 317 becomes "L". Accordingly, the potential of the output signal OUT becomes "H".

At time T12, S0 and S1 are set "L" and "H" respectively. PC is set "L" for a short time after time T12, and then is set "H". Since the transistors 324 and 325 are turned on when PC is set "H", the wiring 323 and the wiring 317 are brought into conduction. That is, the wiring 316 and the wiring 317 are brought into conduction, and the potential of the wiring 317 becomes "L". Accordingly, the potential of the output signal OUT becomes "H".

At time T13, S0 and S1 are set "H". PC is set "L" for a short time after time T13, and then is set "H". Since the transistors 334 and 335 are turned on when PC is set "H", the wiring 333 and the wiring 317 are brought into conduction. However, the wiring 316 and the wiring 333 are out of conduction, and thus the wiring 317 remains "H". Accordingly, the potential of the output signal OUT becomes "L".

That is, by using the driving method in accordance with the timing chart of a PLD between time T8 and time T14 illustrated in FIG. 6, the multiplexer illustrated in FIG. 5 is a circuit equivalent to a NAND circuit in which S0 and S1 are inputs and OUT is an output.

Although the multiplexer in which one output is obtained from the two inputs, S0 and S1, is described here, a multiplexer in which one output is obtained from three or more inputs may be employed.

With such a structure, a PLD including a configuration memory in which the number of transistors per bit is reduced can be made to operate. By forming a memory element using a transistor whose off-state current is extremely small as at least a transistor that supplies a potential to a storage capacitor, a nonvolatile memory can be easily achieved. Further, a PLD including the nonvolatile memory can be made to operate.

This embodiment can be implemented in an appropriate combination with any of the other embodiments.

Embodiment 4

Next, a PLD including a memory element having a structure different from those in Embodiments 1 to 3 according to one embodiment of the present invention will be described with reference to FIG. 7 and FIG. 8. The memory element in this embodiment has a structure in which a transistor is used instead of the storage capacitor that is used in the memory element in Embodiment 3.

(Structure)

Figure 7:
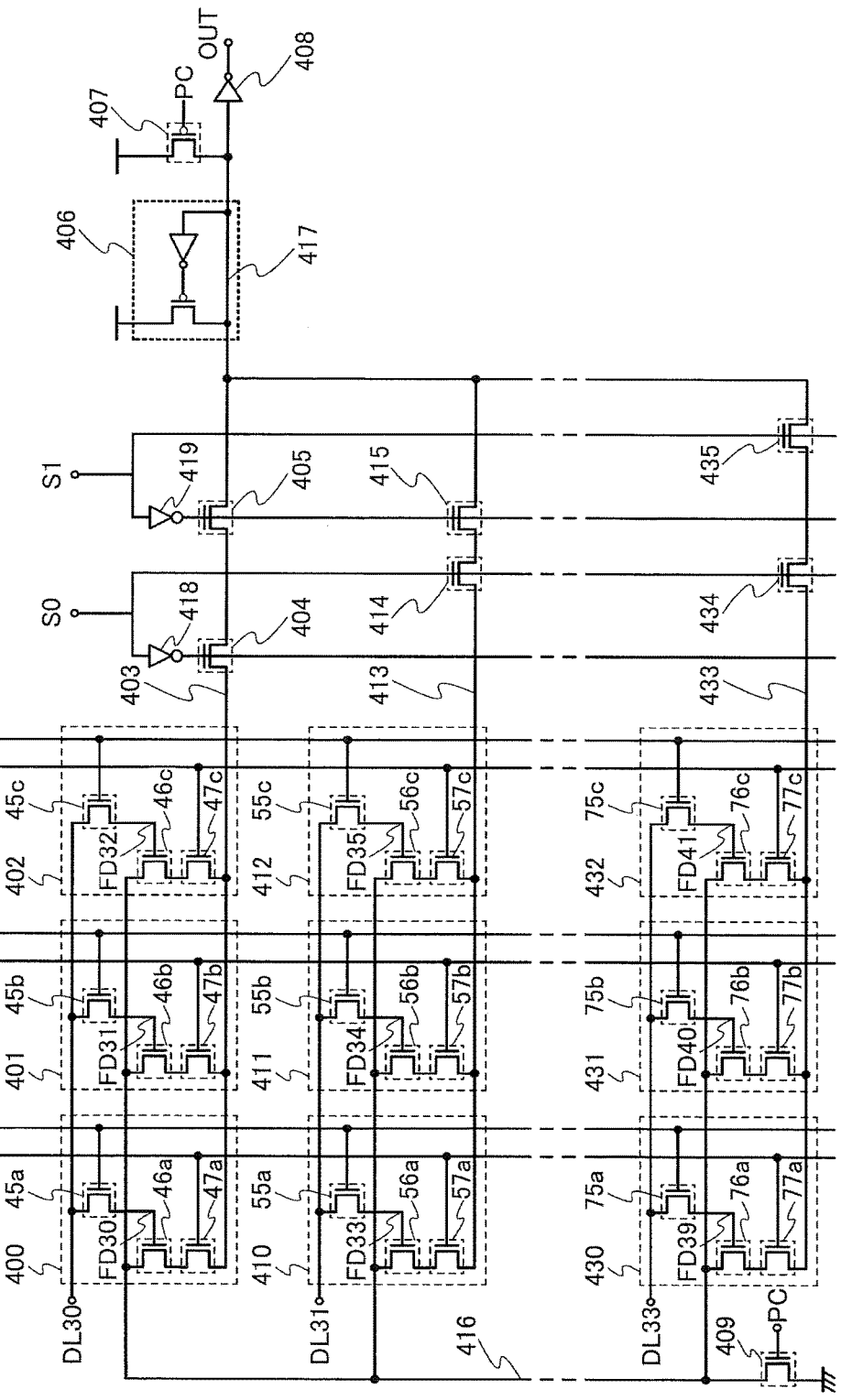
FIG. 7 is a circuit diagram illustrating an example of a PLD according to one embodiment of the present invention.

A multiplexer illustrated in FIG. 7 includes memory elements 400, 401, 402, 410, 411, 412, 420 (not illustrated), 421 (not illustrated), 422 (not illustrated), 430, 431, and 432, transistors 404, 405, 414, 415, 424 (not illustrated), 425 (not illustrated), 434, and 435, a latch circuit 406, a transistor 407, inverters 408, 418, and 419, and a transistor 409. The transistors 404, 405, 414, 415, 424, 425, 434, and 435 function as switches. These transistors, input terminals, and the inverters 418 and 419 form selectors. In FIG. 7, a 1-bit selector including the input terminal to which a signal S0 is input, the inverter 418, and the transistors 404, 414, 424, and 434, and a 1-bit selector including the input terminal to which a signal S1 is input, the inverter 419, and the transistors 405, 415, 425, and 435 are provided.

In FIG. 7, each of the memory elements 400, 401, 402, 410, 411, 412, 420, 421, 422, 430, 431, and 432 includes three transistors. That is, the memory element 400 includes a transistor 45a in which a channel is formed in an oxide semiconductor film, a transistor 46a, and a transistor 47a; the memory element 401 includes a transistor 45b in which a channel is formed in an oxide semiconductor film, a transistor 46b, and a transistor 47b; the memory element 402 includes a transistor 45c in which a channel is formed in an oxide semiconductor film, a transistor 46c, and a transistor 47c; the memory element 410 includes a transistor 55a in which a channel is formed in an oxide semiconductor film, a transistor 56a, and a transistor 57a; the memory element 411 includes a transistor 55b in which a channel is formed in an oxide semiconductor film, a transistor 56b, and a transistor 57b; the memory element 412 includes a transistor 55c in which a channel is formed in an oxide semiconductor film, a transistor 56c, and a transistor 57c; the memory element 430 includes a transistor 65a in which a channel is formed in an oxide semiconductor film, a transistor 66a, and a transistor 67a; the memory element 431 includes a transistor 65b in which a channel is formed in an oxide semiconductor film, a transistor 66b, and a transistor 67b; and the memory element 432 includes a transistor 65c in which a channel is formed in an oxide semiconductor film, a transistor 66c, and a transistor 67c. Any of writing control lines WL0 to WL2 is set "H", so that potentials corresponding to signals from writing data lines DL30 to DL33 can be held in storage capacitors FD30, FD31, FD32, FD33, FD34, FD35, FD36, FD37, FD38, FD39, FD40, and FD41 in the memory elements 400, 401, 402, 410, 411, 412, 420, 421, 422, 430, 431, and 432 respectively. Any of reading control lines RL0 to RL2 is set "H", so that electrical conduction between a wiring 416 and wirings 403, 413, 423 (not illustrated), and 433 can be controlled depending on the potentials held in the storage capacitors FD30, FD31, FD32, FD33, FD34, FD35, FD36, FD37, FD38, FD39, FD40, and FD41 in the memory elements 400, 401, 402, 410, 411, 412, 420, 421, 422, 430, 431, and 432 respectively.

When both the potentials of the signals S0 and S1 are "L", the wiring 403 and a wiring 417 are brought into conduction; when the potentials of the signals S0 and S1 are "H" and "L" respectively, the wiring 413 and the wiring 417 are brought into conduction; when the potentials of the signals S0 and S1 are "L" and "H" respectively, the wiring 423 and the wiring 417 are brought into conduction; and when both the potentials of the signals S0 and S1 are "H", the wiring 433 and the wiring 417 are brought into conduction.

In FIG. 7, when the reading control line RL0 is set "H" after PC is set "L" once and then set "H", the potential of an output signal OUT is "H" in the case where both the potentials of the signals S0 and S1 are "L" and the storage capacitor FD30 holds a potential corresponding to "H"; in the case where the potentials of the signals S0 and S1 are "H" and "L" respectively, and the storage capacitor FD33 holds a potential corresponding to "H"; in the case where the potentials of the signals S0 and S1 are "L" and "H" respectively, and the storage capacitor FD36 holds a potential corresponding to "H"; and in the case where both the potentials of the signals S0 and S1 are "H" and the storage capacitor FD39 holds a potential corresponding to "H". The potential of the output signal OUT is "L" in the other cases.

In a similar manner, in FIG. 7, when the reading control line RL1 is set "H" after PC is set "L" once and then set "H", the potential of the output signal OUT is "H" in the case where both the potentials of the signals S0 and S1 are "L" and the storage capacitor FD31 holds a potential corresponding to "H"; in the case where the potentials of the signals S0 and S1 are "H" and "L" respectively, and the storage capacitor FD34 holds a potential corresponding to "H"; in the case where the potentials of the signals S0 and S1 are "L" and "H" respectively, and the storage capacitor FD37 holds a potential corresponding to "H"; and in the case where both the potentials of the signals S0 and S1 are "H" and the storage capacitor FD40 holds a potential corresponding to "H". The potential of the output signal OUT is "L" in the other cases.

In a similar manner, in FIG. 7, when the reading control line RL2 is set "H" after PC is set "L" once and then set "H", the potential of the output signal OUT is "H" in the case where both the potentials of the signals S0 and S1 are "L" and the storage capacitor FD32 holds a potential corresponding to "H"; in the case where the potentials of the signals S0 and S1 are "H" and "L" respectively, and the storage capacitor FD35 holds a potential corresponding to "H"; in the case where the potentials of the signals S0 and S1 are "L" and "H" respectively, and the storage capacitor FD38 holds a potential corresponding to "H"; and in the case where both the potentials of the signals S0 and S1 are "H" and the storage capacitor FD41 holds a potential corresponding to "H". The potential of the output signal OUT is "L" in the other cases.

For example, the case where the storage capacitors FD30, FD33, FD36, and FD39 hold potentials corresponding to "H", "L", "L", and "L" respectively, the storage capacitors FD31, FD34, FD37, and FD40 hold potentials corresponding to "H", "H", "H", and "L" respectively, and the storage capacitors FD32, FD35, FD38, and FD41 hold potentials corresponding to "L", "H", "H", and "L" respectively will be described.

When the reading control line RL0 is set "H", the potential of the output signal OUT is "H" in the case where both the potentials of S0 and S1 are "L", and the potential of the output signal OUT is "L" in the other cases. That is, the multiplexer illustrated in FIG. 7 is a circuit equivalent to a NOR circuit in which S0 and S1 are inputs and OUT is an output.

When the reading control line RL1 is set "H", the potential of the output signal OUT is "L" in the case where both the potentials of S0 and S1 are "H", and the potential of the output signal OUT is "H" in the other cases. That is, the multiplexer illustrated in FIG. 7 is a circuit equivalent to a NAND circuit in which S0 and S1 are inputs and OUT is an output.

When the reading control line RL2 is set "H", the potential of the output signal OUT is "H" in the case where the potentials of S0 and S1 are "H" and "L" respectively or "L" and "H" respectively, and the potential of the output signal OUT is "L" in the other cases. That is, the multiplexer illustrated in FIG. 7 is a circuit equivalent to an XOR circuit in which S0 and S1 are inputs and OUT is an output.

In this manner, the function of the multiplexer illustrated in FIG. 7 can be changed by changing the potentials stored in the memory elements 400, 401, 402, 410, 411, 412, 420, 421, 422, 430, 431, and 432. Further, the function of the LE including the multiplexer can be changed. In particular, controlling the reading control lines RL0 to RL2 can change the function of the multiplexer immediately.

Although the multiplexer in which one output is obtained from the two inputs, S0 and S1, is described here, a multiplexer in which one output is obtained from three or more inputs may be employed.

With such a structure, a configuration memory in which the number of transistors per bit is reduced can be formed. By forming a memory element using a transistor whose off-state current is extremely small, a nonvolatile memory can be easily achieved. Further, a plurality of pieces of configuration data can be stored and switching of the configuration data can be performed by selecting any of the reading control lines RL0, RL1, and RL2; thus, the time required for reading can be shortened. Accordingly, switching of the configuration data can be performed in a short time. Although a structure in which three sets of configuration data are stored is described here, a structure in which three or more sets of configuration data are stored may be employed.

With such a structure, the area of a region where the configuration memory is disposed can be reduced, and a plurality of sets of configuration data can be stored. Accordingly, a PLD that is easily capable of dynamic reconfiguration can be provided.

(Operation)

Figure 8:
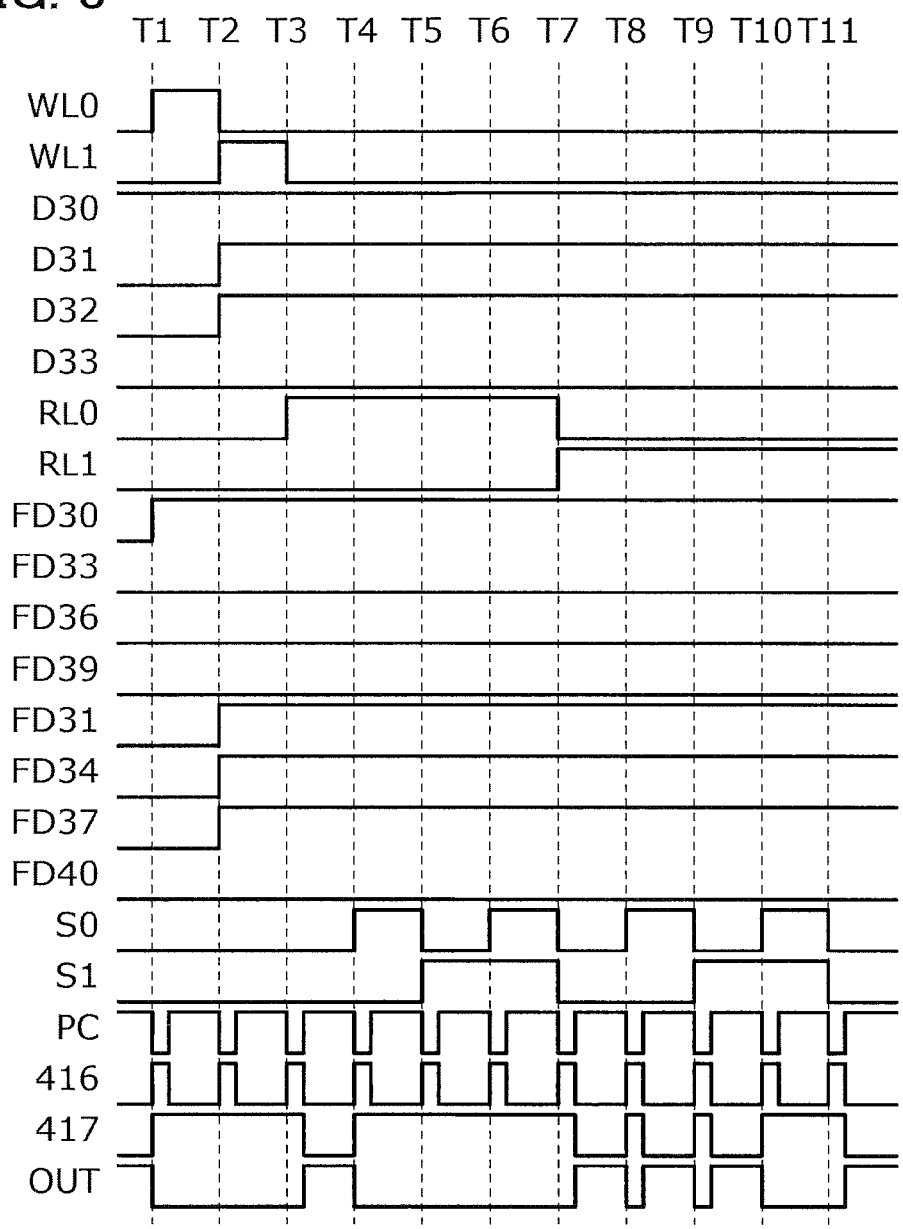
FIG. 8 is a timing chart of a PLD according to one embodiment of the present invention.

FIG. 8 is a timing chart showing an operation method of the multiplexer illustrated in FIG. 7.

First, first writing of configuration data (between time T1 and time T2) will be described.

Between time T1 and time T2, WL0 is set "H", WL1 is set "L", RL0 is set "L", RL1 is set "L", DL30 is set "H", DL31 is set "L", DL32 is set "L", and DL33 is set "L". At this time, the potential of FD30 becomes +V, which corresponds to a potential at which the switches are turned on. That is, "H" is stored as configuration data. The potential of FD33, the potential of FD36, and the potential of FD39 each become 0, which corresponds to a potential at which the switches are turned off. That is, "L" is stored as configuration data.

Next, second writing of configuration data (between time T2 and time T3) will be described.

Between time T2 and time T3, WL0 is set "H", WL1 is set "H", RL0 is set "L", RL1 is set "L", DL30 is set "H", DL31 is set "H", DL32 is set "H", and DL33 is set "L". At this time, the potential of FD30, the potential of FD33, and the potential of FD36 each become +V, which corresponds to a potential at which the switches are turned on. That is, "H" is stored as configuration data. The potential of FD39 becomes 0, which corresponds to a potential at which the switches are turned off. That is, "L" is stored as configuration data.

It is preferable that the potential of PC be continuously "L" and the potential of the wiring 417 be kept at "H" in the first writing and the second writing of configuration data. With such a structure, power consumed during writing of configuration data can be reduced. Further, the wiring 417 is preferably provided with the latch circuit 406. With this structure, the potential of the wiring 417 can be prevented from being a floating potential even when PC is always set "H", and generation of excessive current in the inverter 408 to which the potential of the wiring 417 is input as an input potential can be prevented.

Next, first switching of configuration data (between time T3 and time T7) will be described.

At time T3, RL0 is set "H" and RL1 is set "L". At this time, the memory element 400 is brought into conduction, and the memory elements 410, 420, 430, 401, 411, 421, 431, 402, 412, 422 and 432 are brought out of conduction. Accordingly, the wiring 416 and the wiring 403 are brought into conduction, and the wiring 416 and the wirings 413, 423, and 433 are brought out of conduction.

At time T3, S0 and S1 are set "L". PC is set "L" for a short time after time T3, and then is set "H". Since the transistors 404 and 405 are turned on when PC is set "H", the wiring 403 and the wiring 417 are brought into conduction. That is, the wiring 416 and the wiring 417 are brought into conduction, and the potential of the wiring 417 becomes "L". Accordingly, the potential of the output signal OUT becomes "H".

At time T4, S0 and S1 are set "H" and "L" respectively. PC is set "L" for a short time after time T4, and then is set "H". Since the transistors 414 and 415 are turned on when PC is set "H", the wiring 413 and the wiring 417 are brought into conduction. However, the wiring 416 and the wiring 413 are out of conduction, and thus the wiring 417 remains "H". Accordingly, the potential of the output signal OUT becomes "L".

At time T5, S0 and S1 are set "L" and "H" respectively. PC is set "L" for a short time after time T5, and then is set "H". Since the transistors 424 and 425 are turned on when PC is set "H", the wiring 423 and the wiring 417 are brought into conduction. However, the wiring 416 and the wiring 423 are out of conduction, and thus the wiring 417 remains "H". Accordingly, the potential of the output signal OUT becomes "L".

At time T6, S0 and S1 are set "L". PC is set "L" for a short time after time T6, and then is set "H". Since the transistors 434 and 435 are turned on when PC is set "H", the wiring 433 and the wiring 417 are brought into conduction. However, the wiring 416 and the wiring 433 are out of conduction, and thus the wiring 417 remains "H". Accordingly, the potential of the output signal OUT becomes "L".

Thus, by using the driving method in accordance with the timing chart of a PLD between time T1 and time T7 illustrated in FIG. 8, the multiplexer in FIG. 7 is a circuit equivalent to a NOR circuit in which S0 and S1 are inputs and OUT is an output.

Next, second switching of configuration data (between time T7 and time T11) will be described.

At time T7, RL0 and RL1 are set "L" and "H" respectively. At this time, the memory elements 400, 410, and 420 are brought into conduction, and the memory elements 430, 401, 411, 421, 431, 402, 412, 422, and 432 are brought out of conduction. Accordingly, the wiring 416 and the wirings 403, 413, and 423 are brought into conduction, and the wiring 416 and the wiring 433 are brought out of conduction.

At time T7, S0 and S1 are set "L". PC is set "L" for a short time after time T7, and then is set "H". Since the transistors 404 and 405 are turned on when PC is set "H", the wiring 403 and the wiring 417 are brought into conduction. That is, the wiring 416 and the wiring 417 are brought into conduction, and the potential of the wiring 417 becomes "L". Accordingly, the potential of the output signal OUT becomes "H".

At time T8, S0 and S1 are set "H" and "L" respectively. PC is set "L" for a short time after time T8, and then is set "H". Since the transistors 414 and 415 are turned on when PC is set "H", the wiring 413 and the wiring 417 are brought into conduction. That is, the wiring 416 and the wiring 417 are brought into conduction, and the potential of the wiring 417 becomes "L". Accordingly, the potential of the output signal OUT becomes "H".

At time T9, S0 and S1 are set "L" and "H" respectively. PC is set "L" for a short time after time T9, and then is set "H". Since the transistors 424 and 425 are turned on when PC is set "H", the wiring 423 and the wiring 417 are brought into conduction. That is, the wiring 416 and the wiring 417 are brought into conduction, and the potential of the wiring 417 becomes "L". Accordingly, the potential of the output signal OUT becomes "H".

At time T10, S0 and S1 are set "H". PC is set "L" for a short time after time T10, and then is set "H". Since the transistors 434 and 435 are turned on when PC is set "H", the wiring 433 and the wiring 417 are brought into conduction. However, the wiring 416 and the wiring 433 are out of conduction, and thus the wiring 417 remains "H". Accordingly, the potential of the output signal OUT becomes "L".

Thus, by using the driving method in accordance with the timing chart of a PLD between time T7 and time T11 illustrated in FIG. 8, the multiplexer in FIG. 7 is a circuit equivalent to a NAND circuit in which S0 and S1 are inputs and OUT is an output.

Although the multiplexer in which one output is obtained from the two inputs, S0 and S1, is described here, a multiplexer in which one output is obtained from three or more inputs may be employed.

Although a structure in which two sets of configuration data are stored in a memory element and are switched is described here, a structure in which three or more sets of configuration data are stored in a memory element and are switched may be employed. During the operation in accordance with one set of configuration data among the three or more sets of configuration data, another set of configuration data can be changed.

With such a structure, a PLD which includes a configuration memory in which the number of transistors per bit is reduced can be made to operate. Further, by forming a memory element using a transistor whose off-state current is extremely small, a nonvolatile memory can be easily achieved. A PLD in which the nonvolatile memory is used as a configuration memory can be made to operate. Furthermore, the area of a region where the configuration memory is disposed can be easily reduced. Accordingly, a plurality of pieces of configuration data can be stored, and dynamic reconfiguration of a PLD can be performed in a short time.

This embodiment can be implemented in an appropriate combination with any of the other embodiments.

Embodiment 5

Next, a PLD including a memory element having a structure different from those in Embodiments 1 to 4 according to one embodiment of the present invention will be described with reference to FIG. 9 and FIG. 10. The memory element in this embodiment is different from the memory element in Embodiment 3 in that a storage capacitor is not used.

(Structure)

Figure 9:
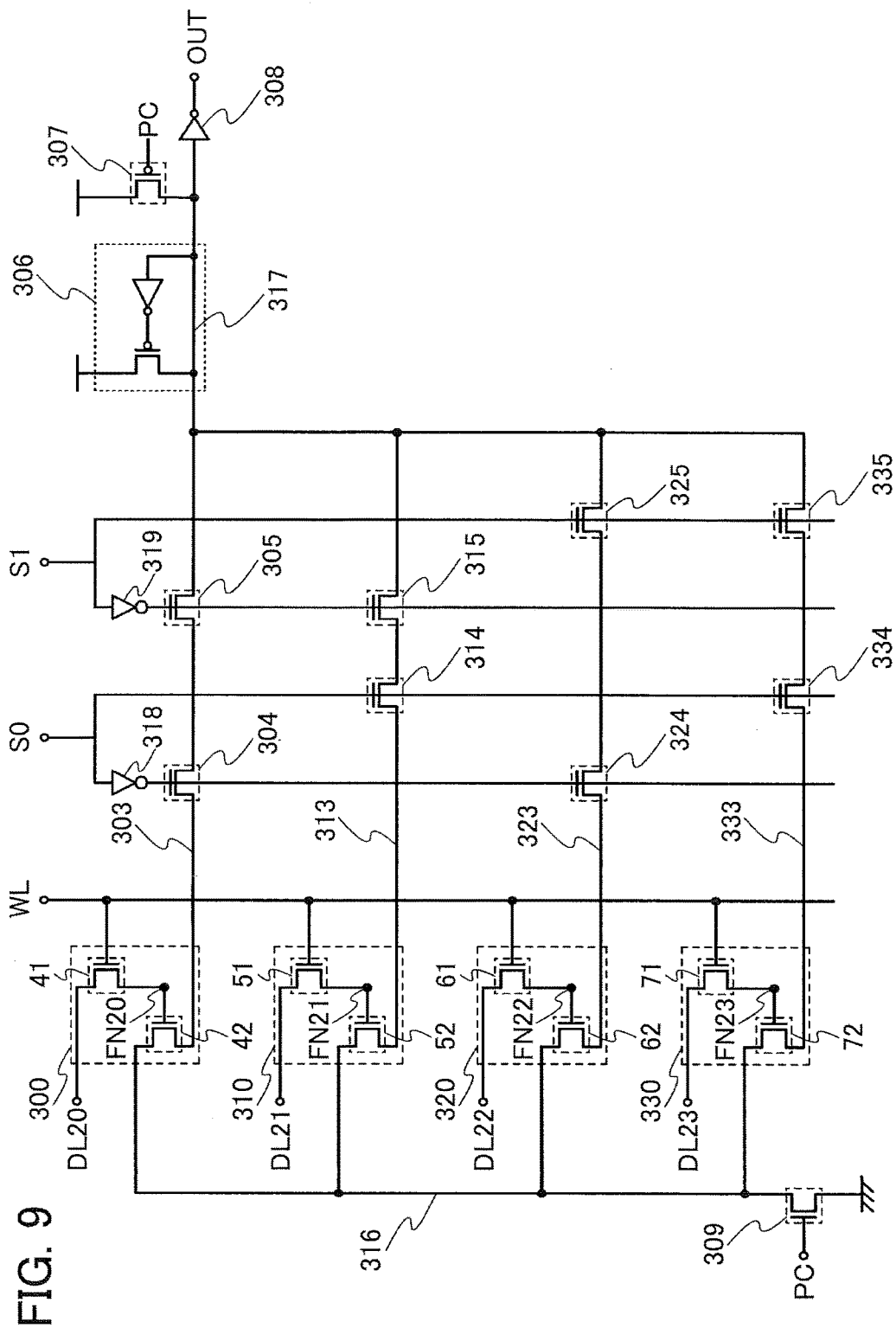
FIG. 9 is a circuit diagram illustrating an example of a PLD according to one embodiment of the present invention.

FIG. 9 illustrates the structure of a multiplexer in an LE of a PLD. The multiplexer includes memory elements 300, 310, 320, and 330, transistors 304, 305, 314, 315, 324, 325, 334, and 335, a latch circuit 306, a transistor 307, inverters 308, 318, and 319, and a transistor 309. The transistors 304, 305, 314, 315, 324, 325, 334, and 335 function as switches. These transistors, input terminals, and the inverters 318 and 319 form selectors. In FIG. 9, a 1-bit selector including the input terminal to which a signal S0 is input, the inverter 318, and the transistors 304, 314, 324, and 334, and a 1-bit selector including the input terminal to which a signal S1 is input, the inverter 319, and the transistors 305, 315, 325, and 335 are provided.

Although the latch circuit 306 is provided in the multiplexer of this embodiment, the latch circuit 306 is not necessarily provided.

In FIG. 9, each of the memory elements 300, 310, 320, and 330 includes two transistors. That is, the memory element 300 includes a transistor 41 in which a channel is formed in an oxide semiconductor film and a transistor 42; the memory element 310 includes a transistor 51 in which a channel is formed in an oxide semiconductor film and a transistor 52; the memory element 320 includes a transistor 61 in which a channel is formed in an oxide semiconductor film and a transistor 62; and the memory element 330 includes a transistor 71 in which a channel is formed in an oxide semiconductor film and a transistor 72. A writing control line WL is set "H", so that potentials corresponding to signals from writing data lines DL20, DL21, DL22, and DL23 can be held in nodes FN20, FN21, FN22, and FN23 in the memory elements 300, 310, 320, and 330 respectively. Electrical conduction between a wiring 316 and wirings 303, 313, 323, and 333 can be controlled depending on the potentials held in the nodes FN20, FN21, FN22, and FN23 in the memory elements 300, 310, 320, and 330 respectively.

When both the potentials of the signals S0 and S1 are "L", the wiring 303 and a wiring 317 are brought into conduction; when the potentials of the signals S0 and S1 are "H" and "L" respectively, the wiring 313 and the wiring 317 are brought into conduction; when the potentials of the signals S0 and S1 are "L" and "H" respectively, the wiring 323 and the wiring 317 are brought into conduction; and when both the potentials of the signals S0 and S1 are "H", the wiring 333 and the wiring 317 are brought into conduction.

In FIG. 9, when PC (pre-charge) is set "L" once and then set "H", the potential of an output signal OUT is "H" in the case where both the potentials of the signals S0 and S1 are "L" and the node FN20 holds a potential corresponding to "H"; in the case where the potentials of the signals S0 and S1 are "H" and "L" respectively, and the node FN21 holds a potential corresponding to "H"; in the case where the potentials of the signals S0 and S1 are "L" and "H" respectively, and the node FN22 holds a potential corresponding to "H"; and in the case where both the potentials of the signals S0 and S1 are "H" and the node FN23 holds a potential corresponding to "H". The potential of the output signal OUT is "L" in the other cases.

For example, when the nodes FN20, FN21, FN22, and FN23 hold potentials corresponding to "H", "L", "L", and "L" respectively, the potential of the output signal OUT is "H" in the case where both the potentials of S0 and S1 are "L", and the potential of the output signal OUT is "L" in the other cases. That is, the multiplexer illustrated in FIG. 9 is a circuit equivalent to a NOR circuit in which S0 and S1 are inputs and OUT is an output. As another example, when the nodes FN20, FN21, FN22, and FN23 hold potentials corresponding to "H", "H", "H", and "L" respectively, the potential of the output signal OUT is "L" in the case where both the potentials of S0 and S1 are "H", and the potential of the output signal OUT is "H" in the other cases. That is, the multiplexer illustrated in FIG. 9 is a circuit equivalent to a NAND circuit in which S0 and S1 are inputs and OUT is an output.

In this manner, the function of the multiplexer illustrated in FIG. 9 can be changed by changing the potentials stored in the memory elements 300, 310, 320, and 330. Further, the function of the LE including the multiplexer can be changed.

Although the multiplexer in which one output is obtained from the two inputs, S0 and S1, is described here, a multiplexer in which one output is obtained from three or more inputs may be employed.

With such a structure, a configuration memory in which the number of transistors per bit is reduced can be formed. By forming a memory element using a transistor whose off-state current is extremely small, a nonvolatile memory can be easily achieved.

(Operation)

Figure 10:
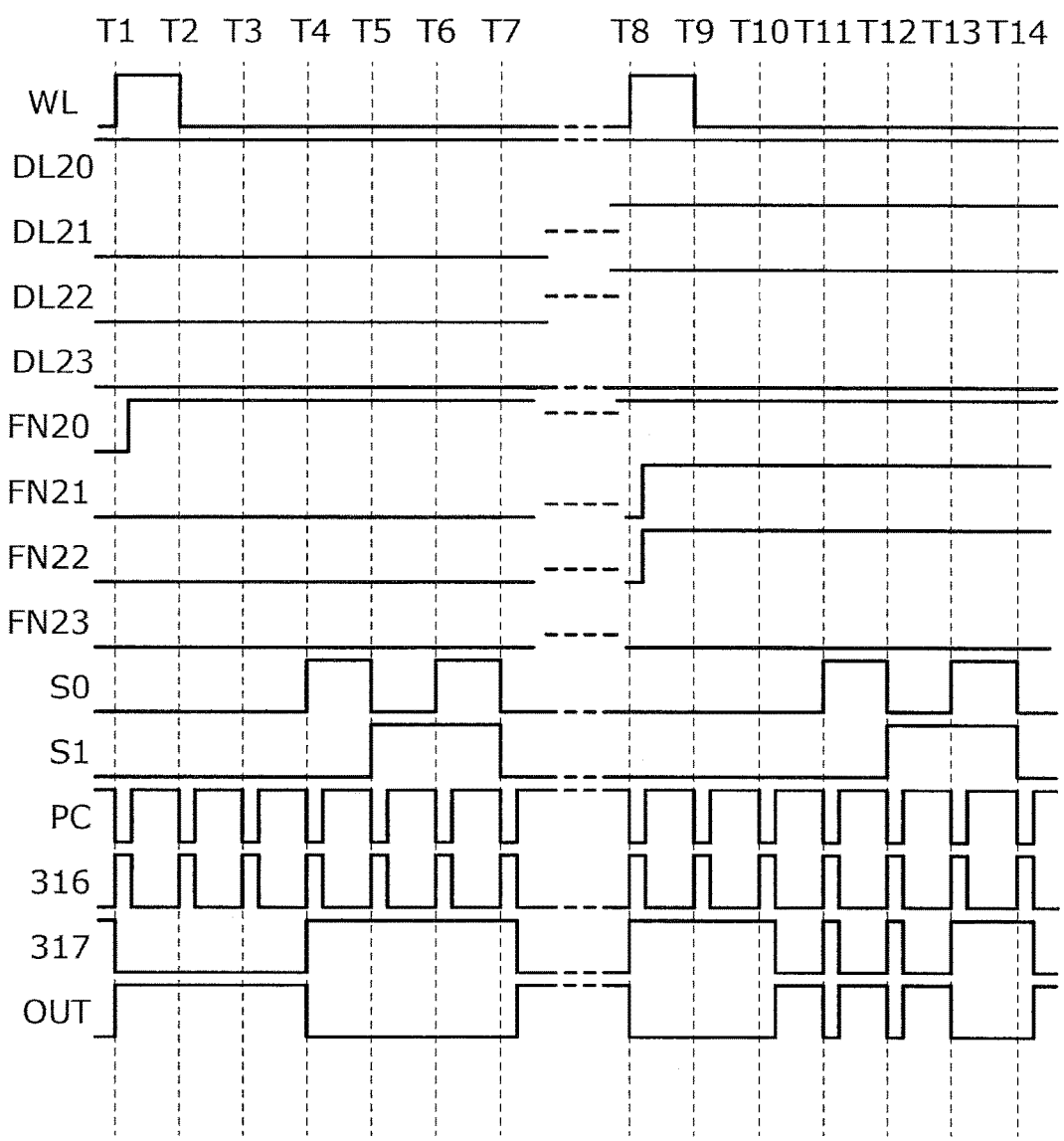
FIG. 10 is a timing chart of a PLD according to one embodiment of the present invention.

FIG. 10 is a timing chart showing an operation method of the multiplexer illustrated in FIG. 9.

Here, as one example, the potential of the writing control line WL is +V (corresponding to "H") or −V (corresponding to "L"), the potential of each of the writing data lines DL20 to DL23 is 0 (corresponding to "H") or −V (corresponding to "L"), and the potential of each of the wirings 316 and 317 and the output signal OUT is +V (corresponding to "H") or 0 (corresponding to "L").

First, first writing of configuration data (between time T1 and time T2) will be described.

Between time T1 and time T2, WL is set "H", DL20 is set "H", DL21 is set "L", DL22 is set "L", and DL23 is set "L". At this time, the potential of FN20 becomes 0, which corresponds to a potential at which the switches are turned on. That is, "H" is stored as configuration data. The potential of FN21, the potential of FN22, and the potential of FN23 each become −V, which corresponds to a potential at which the switches are turned of That is, "L" is stored as configuration data.

It is preferable that the potential of PC be continuously "L" and the potential of the wiring 317 be kept at "H" in the first writing of configuration data. With such a structure, power consumed during writing of configuration data can be reduced. Further, the wiring 317 is preferably provided with the latch circuit 306. With this structure, the potential of the wiring 317 can be prevented from being a floating potential even when PC is always set "H", and generation of excessive current in the inverter 308 to which the potential of the wiring 317 is input as an input potential can be prevented.

Next, first switching of configuration data (between time T3 and time T7) will be described.

At time T3, S0 and S1 are set "L". PC is set "L" for a short time after time T3, and then is set "H". Since the transistors 304 and 305 are turned on when PC is set "H", the wiring 303 and the wiring 317 are brought into conduction. That is, the wiring 316 and the wiring 317 are brought into conduction, and the potential of the wiring 317 becomes "L". Accordingly, the potential of the output signal OUT becomes "H".

At time T4, S0 and S1 are set "H" and "L" respectively. PC is set "L" for a short time after time T4, and then is set "H". Since the transistors 314 and 315 are turned on when PC is set "H", the wiring 313 and the wiring 317 are brought into conduction. However, the wiring 316 and the wiring 313 are out of conduction, and thus the wiring 317 remains "H". Accordingly, the potential of the output signal OUT becomes "L".

At time T5, S0 and S1 are set "L" and "H" respectively. PC is set "L" for a short time after time T5, and then is set "H". Since the transistors 324 and 325 are turned on when PC is set "H", the wiring 323 and the wiring 317 are brought into conduction. However, the wiring 316 and the wiring 323 are out of conduction, and thus the wiring 317 remains "H". Accordingly, the potential of the output signal OUT becomes "L".

At time T6, S0 and S1 are set "H". PC is set "L" for a short time after time T6, and then is set "H". Since the transistors 334 and 335 are turned on when PC is set "H", the wiring 333 and the wiring 317 are brought into conduction. However, the wiring 316 and the wiring 333 are out of conduction, and thus the wiring 317 remains "H". Accordingly, the potential of the output signal OUT becomes "L".

Thus, by using the driving method in accordance with the timing chart of a PLD between time T1 and time T7 illustrated in FIG. 10, the multiplexer in FIG. 9 is a circuit equivalent to a NOR circuit in which S0 and S1 are inputs and OUT is an output.

Next, second writing of configuration data (between time T8 and time T9) will be described.

Between time T8 and time T9, WL is set "H", DL20 is set "H", DL21 is set "H", DL22 is set "H", and DL23 is set "L". At this time, the potential of FN20, the potential of FN21, and the potential of FN22 each become 0, which corresponds to a potential at which the switches are turned on. That is, "H" is stored as configuration data. The potential of FN23 becomes −V, which corresponds to a potential at which the switches are turned off. That is, "L" is stored as configuration data.

It is preferable that the potential of PC be continuously "L" and the potential of the wiring 317 be kept at "H" in the second writing of configuration data. With such a structure, power consumed during writing of configuration data can be reduced. Further, the wiring 317 is preferably provided with the latch circuit 306. With this structure, the potential of the wiring 317 can be prevented from being a floating potential even when PC is always set "H", and generation of excessive current in the inverter 308 to which the potential of the wiring 317 is input as an input potential can be prevented.

Next, second switching of configuration data (between time T10 and time T14) will be described.

At time T10, S0 and S1 are set "L". PC is set "L" for a short time after time T10, and then is set "H". Since the transistors 304 and 305 are turned on when PC is set "H", the wiring 303 and the wiring 317 are brought into conduction. That is, the wiring 316 and the wiring 317 are brought into conduction, and the potential of the wiring 317 becomes "L". Accordingly, the potential of the output signal OUT becomes "H".

At time T11, S0 and S1 are set "H" and "L" respectively. PC is set "L" for a short time after time T11, and then is set "H". Since the transistors 314 and 315 are turned on when PC is set "H", the wiring 313 and the wiring 317 are brought into conduction. That is, the wiring 316 and the wiring 317 are brought into conduction, and the potential of the wiring 317 becomes "L". Accordingly, the potential of the output signal OUT becomes "H".

At time T12, S0 and S1 are set "L" and "H" respectively. PC is set "L" for a short time after time T12, and then is set "H". Since the transistors 324 and 325 are turned on when PC is set "H", the wiring 323 and the wiring 317 are brought into conduction. That is, the wiring 316 and the wiring 317 are brought into conduction, and the potential of the wiring 317 becomes "L". Accordingly, the potential of the output signal OUT becomes "H".

At time T13, S0 and S1 are set "H". PC is set "L" for a short time after time T13, and then is set "H". Since the transistors 334 and 335 are turned on when PC is set "H", the wiring 333 and the wiring 317 are brought into conduction. However, the wiring 316 and the wiring 333 are out of conduction, and thus the wiring 317 remains "H". Accordingly, the potential of the output signal OUT becomes "L".

That is, by using the driving method in accordance with the timing chart of a PLD between time T8 and time T14 illustrated in FIG. 10, the multiplexer illustrated in FIG. 9 is a circuit equivalent to a NAND circuit in which S0 and S1 are inputs and OUT is an output.

Although the multiplexer in which one output is obtained from the two inputs, S0 and S1, is described here, a multiplexer in which one output is obtained from three or more inputs may be employed.

With such a structure, a PLD including a configuration memory in which the number of transistors per bit is reduced can be made to operate. Further, by forming a memory element using a transistor whose off-state current is extremely small, a nonvolatile memory can be easily achieved. Furthermore, a PLD including the nonvolatile memory can be made to operate.

This embodiment can be implemented in an appropriate combination with any of the other embodiments.

Embodiment 6

Next, a PLD including an LE having a structure different from those in Embodiments 1 to 5 according to one embodiment of the present invention will be described with reference to FIG. 11 and FIG. 12.

(Structure)

FIG. 11 illustrates the structure of an LE of a PLD. The LE in this embodiment has the structure of the LE described in Embodiment 3 with two latch circuits. Specifically, the output terminal (OUT) of the LE illustrated in FIG. 5 in Embodiment 3 branches into two terminals. One of the two terminals is electrically connected to latches 381 and 382 in series, and output of the latch 382 corresponds to SOUT. Therefore, the structure of a multiplexer is the same as that described in Embodiment 3. The output of the multiplexer is input to AOUT which is the other of the two terminals. Further, the output of the multiplexer is sequentially latched in the latch 381 by a clock signal PH2 and in the latch 382 by a clock signal PH1.

Here, the latches 381 and 382 are level-sensitive latches; when "H" is input to G; the potential of D is output to Q, and when "L" is input to G, the potential of Q is held. The clock signals PH1 and PH2 are signals which do not become "H" concurrently. With such a structure, the latches 381 and 382 function as an edge-sensitive latch (also referred to as flip-flop) using the clock signal PH1 as a clock signal. Note that in the case where a period during which both the clock signal PH1 and the clock signal PH2 are "L" concurrently is provided, the clock signal PH1 and the clock signal PH2 are referred to as non-overlap clock signals. The use of the non-overlap clock signals has an advantage that a problem such as data racing is less likely to occur, and thus a clock signal can be easily supplied even in a large-scaled PLD.

The output of the multiplexer is input to the flip-flop formed of the latches 381 and 382, so that the output signal SOUT which is synchronized with the rise of the clock signal PH1 can be obtained. The output signal SOUT can be used as an input signal of another LE.

With such a structure, a configuration memory in which the number of transistors per bit is reduced can be formed. By forming a memory element using a transistor whose off-state current is extremely small as at least a transistor that supplies a potential to a storage capacitor, a nonvolatile memory can be easily achieved.

With such a structure, the area of a region where the configuration memory is disposed can be reduced, and thus a plurality of sets of configuration memories are provided so that a plurality of sets of configuration data can be easily stored. Accordingly, a PLD that is easily capable of dynamic reconfiguration can be provided.

(Operation)

FIG. 12 is a timing chart showing an operation method of the multiplexer illustrated in FIG. 11. The operation method of the multiplexer in this embodiment is the same as that described in Embodiment 3.

Here, when the clock signals PH1 and PH2 are supplied as shown in FIG. 12, the potential of the output signal SOUT becomes "H" at time T4, "L" at time T5, "L" at time T6, and "L" at time T7. In the case where the potentials of the signals S0 and S1 are changed, PC needs to be set "L" and then be set "H". When the inversion signal of PH1 is input to PC, the number of signal lines can be reduced.

It is preferable that, in the writing of configuration data, the potentials of PH1, PH2, and PC be constant so that the potential of the wiring 317 can be constant. With such a structure, power consumed during writing of configuration data can be reduced. Further, the wiring 317 is preferably provided with the latch circuit 306. With this structure, the potential of the wiring 317 can be prevented from being a floating potential even when PC is always set "H", and generation of excessive current in the inverter 308 to which the potential of the wiring 317 is input as an input potential can be prevented.

By using the driving method illustrated in FIG. 12, the multiplexer in FIG. 11 is a circuit equivalent to a NOR circuit in which S0 and S1 are inputs and AOUT and SOUT are outputs.

Although the multiplexer in which one output is obtained from the two inputs, S0 and S1, is described here, a multiplexer in which one output is obtained from three or more inputs may be employed. Although a structure in which one set of configuration data is stored is described here, a structure in which two or more sets of configuration data are stored may be employed. Specifically, a plurality of sets of memory elements controlled by a plurality of writing control lines and a plurality of reading control lines can be prepared; in this case, writing of configuration data can be performed by selecting any of the plurality of writing control lines, and switching of configuration data can be performed by selecting any of the plurality of reading control lines. In this way, the time required for reading can be shortened, and switching of configuration data can be performed in a short time.

With such a structure, a PLD including a configuration memory in which the number of transistors per bit is reduced can be made to operate. Further, by forming a memory element using a transistor whose off-state current is extremely small, a nonvolatile memory can be easily achieved. Furthermore, a PLD including the nonvolatile memory can be made to operate.

The clock signals PH1 and PH2 are preferably two-phase non-overlap clock signals. In particular, a structure in which the duty ratios of the clock signals PH1 and PH2 can be changed is preferable. At the time of storing and restoring data to/from a nonvolatile register, the two-phase clock signals are preferably stopped. With such a structure, the reliability of circuit operation can be improved, and a small-scaled clock signal generation circuit that can be used for normally-off operation can be provided.

Figure 16:
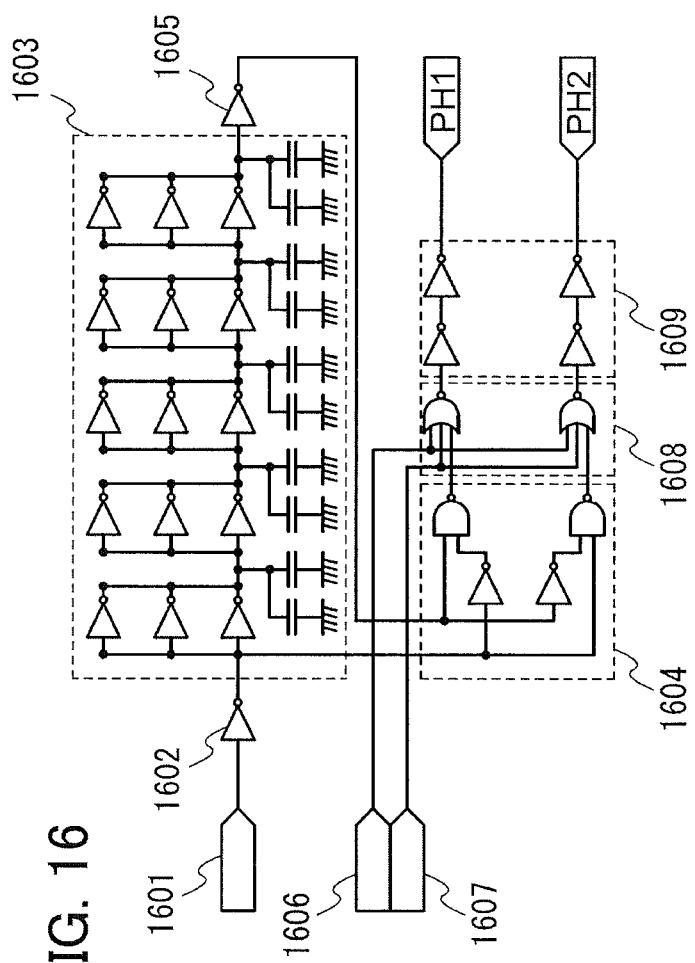
FIG. 16 is a circuit diagram illustrating an example of a clock signal generation circuit in a PLD according to one embodiment of the present invention.

FIG. 16 illustrates a clock signal generation circuit in the PLD of this embodiment. Here, a single-phase clock signal 1601 input from the outside is transmitted to an inverter chain block 1603 and a combinational circuit 1604 through a buffer circuit 1602. A signal output from the inverter chain block 1603 is transmitted to the combinational circuit 1604 through a buffer circuit 1605. A control signal 1606, a control signal 1607, and a signal output from the combinational circuit 1604 are transmitted to a combinational circuit 1608. A signal output from the combinational circuit 1608 is transmitted to a buffer circuit 1609. The buffer circuit 1609 outputs the clock signals PH1 and PH2.

The buffer circuit 1602 has a function of amplifying the single-phase clock signal 1601. In the example illustrated in FIG. 16, the buffer circuit 1602 is formed of one inverter circuit; however, the number of stages of inverter circuits, the driving capability thereof, and the like can be changed as appropriate depending on the input capacitance of the inverter chain block 1603 or the combinational circuit 1604 or the like.

The inverter chain block 1603 includes a five-stage inverter chain in which three inverter circuits connected in parallel are provided in each stage. Two capacitors connected in parallel are connected to an output signal line of the inverter circuits in each stage. Here, the output signal line of the inverter circuits in each stage can be cut as appropriate by laser cutting, whereby one inverter circuit can be provided in each stage in the inverter chain or two or three inverter circuits connected in parallel can be provided in each stage in the inverter chain. That is, the driving capability of each stage in the inverter chain can be equal to that of one inverter, or can be twice or three times that of one inverter. Further, when connection between the output signal line of the inverter circuits in each stage and the two capacitors connected in parallel is cut as appropriate by laser cutting, the net load capacitance of the each stage in the inverter chain can be zero, can be equal to that of one capacitor, or can be twice that of one capacitor. In other words, changing the driving capability and load capacitance of each stage in the inverter chain as appropriate can lead to a change in the delay time of the inverter chain. Note that the number of stages of the inverter chain, the number of inverter circuits in each stage, the number of capacitors connected to the output signal line of the inverter circuits in each stage, and the like can be changed as appropriate depending on the required specifications.

The buffer circuit 1605 shapes the waveform of a signal output from the inverter chain block 1603 and outputs the shaped signal to the combinational circuit 1604. In the example illustrated in FIG. 16, the buffer circuit 1605 is formed of one inverter circuit; however, the number of stages of the inverter circuits, the driving capability thereof, and the like can be changed as appropriate depending on the input capacitance of the combinational circuit 1604 or the like.

The combinational circuit 1604 generates a signal whose pulse width corresponds to the time lag between the single-phase clock signal 1601 transmitted through the inverter chain block 1603 and the buffer circuit 1605 and the single-phase clock signal 1601 not transmitted through the inverter chain block 1603 or the buffer circuit 1605. That is, since the delay time of the inverter chain block can be changed by laser cutting as described above, the pulse width of a signal generated by the combinational circuit 1604 can be changed. One of signals generated by the combinational circuit 1604 is for the rising edge of the single-phase clock signal 1601, and the other thereof is for the falling edge of the single-phase clock signal 1601.

The clock signals PH1 and PH2 are stopped at the time of storing and restoring data to/from a nonvolatile register; thus, the clock signals PH1 and PH2 are generated in the combinational circuit 1608 in accordance with the two control signals 1606 and 1607 and an output signal of the combinational circuit 1604. Specifically, the potentials of the control signals 1606 and 1607 are set "H" at the time of storing and restoring data to/from the nonvolatile register. At this time, the potentials of the clock signals PH1 and PH2 become "L".

The buffer circuit 1609 amplifies the output signal of the combinational circuit 1608 so that the clock signals PH1 and PH2 are generated. The clock signals PH1 and PH2 are output to LEs in the PLD.

Note that the duty ratios of the two-phase clock signals (PH1 and PH2) generated by the clock signal generation circuit are changed depending on the operation characteristics of the inverter circuits in the inverter chain block 1603. In other words, the duty ratios of the two-phase clock signals are changed depending on the process variations. However, since the response speed of the register using the two-phase clock signals is also changed, the duty ratios of the two-phase clock signals are less likely to be affected by the process variations that determine the transistor characteristics. Accordingly, the yield can be improved. Specifically, in the case where the transistor characteristics are favorable owing to the process variations, the amount of delay in a delay circuit is small, and thus the duty ratios of the two-phase clock signals are decreased. On the other hand, the response speed of the register becomes high, and thus the two-phase clock signals can be used as clock signals of the register.

This embodiment can be implemented in an appropriate combination with any of the other embodiments.

Embodiment 7

Figure 13A:
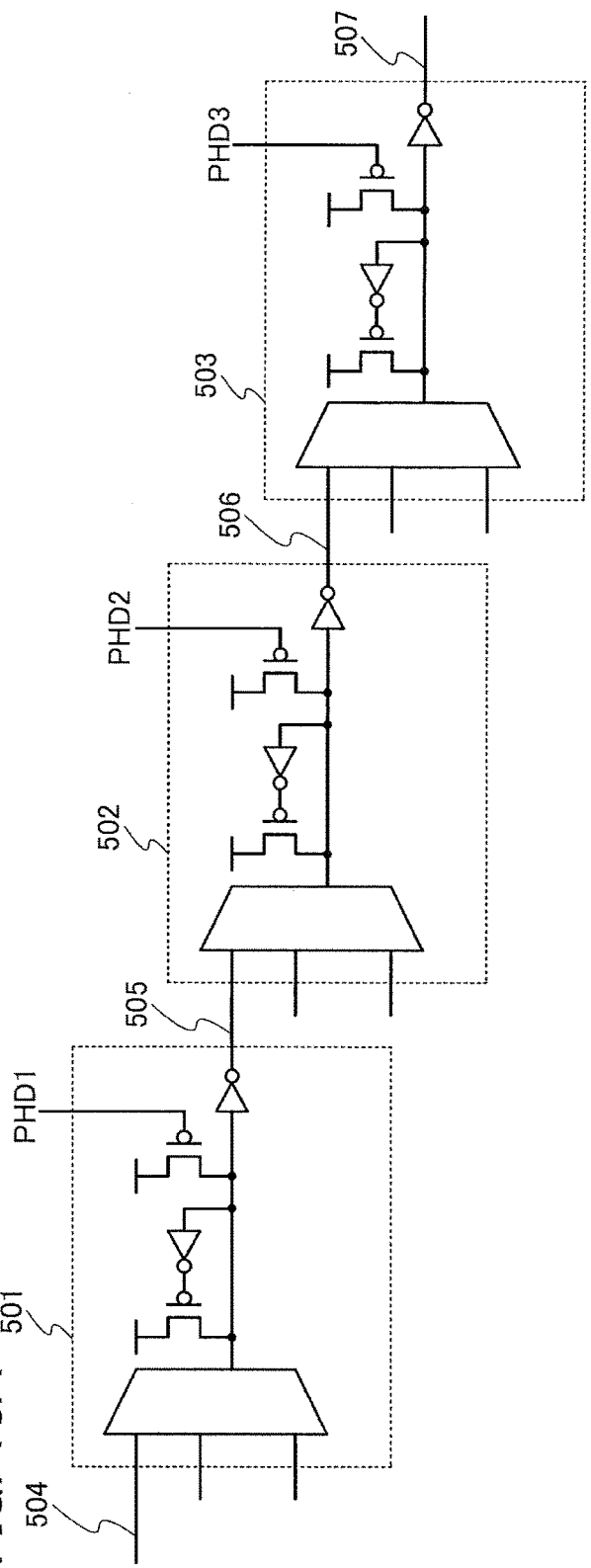
FIGS. 13A and 13B are a circuit diagram illustrating an example of a PLD according to one embodiment of the present invention and a timing chart of the PLD.

Next, a PLD including a memory element having a structure different from those in Embodiments 1 to 6 according to one embodiment of the present invention will be described with reference to FIGS. 13A and 13B.

The outputs of a plurality of multiplexers can be used as an input of another multiplexer at the time of changing the circuit structure of the multiplexers by the input of configuration data, whereby a more complex circuit function using a plurality of multiplexers can be achieved. For example, first to third multiplexers each having two inputs are used, and the outputs of the first and second multiplexers are used as an input of the third multiplexer; thus, a four-input multiplexer can be achieved.

A method for achieving a more complex circuit structure using a plurality of multiplexers in an LE according to one embodiment of the present invention will be described with reference to FIGS. 13A and 13B. In FIG. 13A, LEs 501, 502, and 503 are each a simplified drawing of the logic element illustrated in FIG. 11. A signal 504 is input to a multiplexer in the LE 501, and a signal 505 is output from the multiplexer in the LE 501. A signal 505 is input to a multiplexer in the LE 502, and a signal 506 is output from the multiplexer in the LE 502. A signal 506 is input to a multiplexer in the LE 503, and a signal 507 is output from the multiplexer in the LE 503.

Here, the output of the multiplexer in each of the LEs 501, 502, and 503 is determined after a certain period of time from the time at which PC is changed from "L" to "H". Therefore, when the same signal is input to the LEs 501, 502, and 503 as PCs, the output of the multiplexer in the LE 503 does not become the value reflecting the output from the LE2 in some cases. That is, before the output of the multiplexer in the LE 501 is set to a predetermined value, the output of the multiplexer in the LE 502 is determined using the output of the multiplexer in the LE 501 in some cases. Further, before the output of the multiplexer in the LE 502 is set to a predetermined value, the output of the multiplexer in the LE 503 is determined using the output of the multiplexer in the LE 502 in some cases.

Figure 13B:
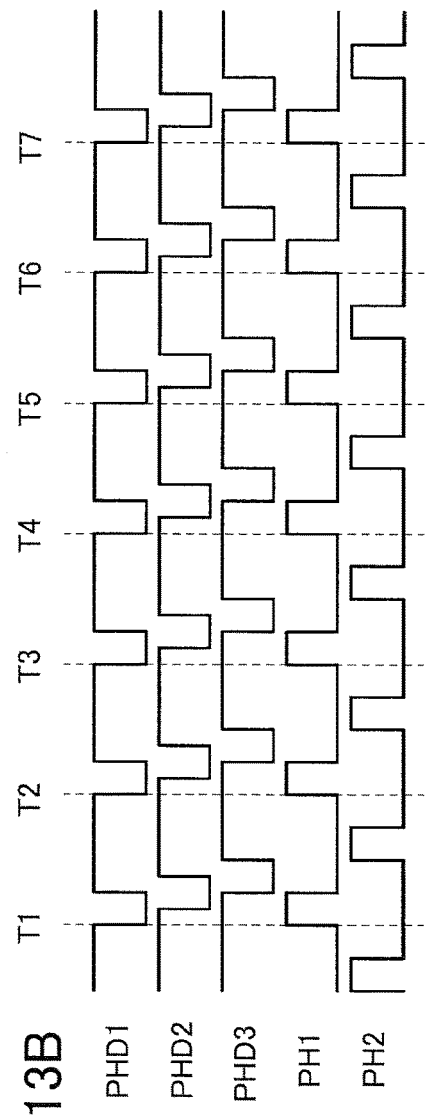

In view of this, PHD1, PHD2, and PHD3 are supplied as PCs to be supplied to the LEs 501, 502, and 503 in accordance with the timing chart of FIG. 13B. Note that the clock signals PH1 and PH2 are supplied in common to the LEs 501, 502, and 503.

Here, as constraint on PHD1, PHD2, and PHD3, the following three conditions should be met. That is, as a first condition, PHD1, PHD2, and PHD3 are sequentially changed from "L" to "H". As a second condition, after the rising of PH1, PHD1, PHD2, and PHD3 are changed from "H" to "L". As a third condition, before PH2 is changed from "H" to "L", PHD3 is changed from "L" to "H".

By the first condition, before the output of the multiplexer in the previous stage is determined, the output of the multiplexer in the next stage can be prevented from being determined as described above. Specifically, PHD2 is changed from "L" to "H" after a period of time required for determining the output of the multiplexer in the LE 501 from the time at which PHD1 is changed from "L" to "H". Further, PHD3 is changed from "L" to "H" after a period of time required for determining the output of the multiplexer in the LE 502 from the time at which PHD2 is changed from "L" to "H".

By the second condition, input data of the flip-flop in each of the LEs can be determined at the time of positive edge of PH1.

By the third condition, the output of the multiplexer in the LE 503, which is the multiplexer in the last stage, can be surely input to the flip-flop in the LE 503. Specifically, before PH2 is changed from "H" to "L", PHD3 is changed from "L" to "H" after a period of time required for determining the output of the multiplexer in the LE 503 from the time at which PHD3 is changed from "H" to "L".

Note that the number of signal lines can be reduced by employing a structure in which the inversion signal of PH1 is used as PHD1.

As PHD1, PHD2, and PHD3, signals satisfying the above conditions can be generated using either a desired counter circuit or a delay circuit. The delay circuit can be formed using a resistor and a capacitor. A structure in which PHD1, PHD2, and PHD3 are supplied to each of the LEs and each of the LEs selects any of PHD1, PHD2, and PHD3 may be employed. Note that as a switch for selection, a memory element similar to that illustrated in FIG. 11 can be used. Further, a structure may also be employed in which a signal corresponding to PHD1 is supplied to each LE, a delay circuit and a memory element are provided in each LE, and the amount of delay is changed by the delay circuit depending on data stored in the memory element, so that signals corresponding to PHD1, PHD2, and PHD3 are generated in each LE.

Although an example where three-stage multiplexers are used is described here, the number of stages of multiplexers is not limited to three.

With such a structure, a PLD which includes a configuration memory in which the number of transistors per bit is reduced can be made to operate. Further, by forming a memory element using a transistor whose off-state current is extremely small, a nonvolatile memory can be easily achieved. A PLD in which the nonvolatile memory is used as a configuration memory can be made to operate. Furthermore, the area of a region where the configuration memory is disposed can be easily reduced. Accordingly, a plurality of pieces of configuration data can be stored, and dynamic reconfiguration of a PLD can be performed in a short time.

This embodiment can be implemented in an appropriate combination with any of the other embodiments.

Embodiment 8

In this embodiment, an example of a cross section in the case where a transistor in which a channel is formed in an oxide semiconductor and a transistor in which a channel is formed in a single crystal silicon wafer are used for a memory element in the PLD described in Embodiment 3 and an example of a manufacturing method thereof will be described with reference to FIG. 14. Here, for the sake of convenience, a transistor in which a channel is formed in an oxide semiconductor is referred to as a first transistor 902, and a transistor in which a channel is formed in a single crystal silicon wafer is referred to as a second transistor 901.

Note that a semiconductor material such as germanium, silicon germanium, or single crystal silicon carbide as well as silicon may be used for the second transistor 901 included in the memory element. A transistor including silicon can be formed using a silicon thin film formed in an SOI substrate or a silicon thin film formed by vapor deposition, for example; in this case, a glass substrate formed by a fusion process or a float process, a quartz substrate, a semiconductor substrate, a ceramic substrate, or the like can be used as a substrate. In the case where a glass substrate is used and the temperature of heat treatment to be performed later is high, it is preferable to use a glass substrate with a strain point of 730° C. or higher FIG. 14 illustrates an embodiment of a cross-sectional structure showing the circuit structure that stores one piece of configuration data in the memory element. In this case, the second transistor 901 using a single crystal silicon wafer is formed, and the first transistor 902 using an oxide semiconductor and a capacitor 903 are formed above the second transistor 901. In other words, the memory element described in this embodiment is a semiconductor device that has a three-dimensional layered structure in which a silicon wafer is used as a substrate and a layer of the first transistor 902 is provided above the silicon wafer. Moreover, the memory element in this embodiment is a hybrid semiconductor device including a transistor in which silicon is used for a channel formation region and a transistor in which an oxide semiconductor is used for a channel formation region.

Although only a cross section of the structure of part of the memory element is shown in this embodiment, a logic element or another circuit can be configured with this layered structure. Thus, the whole PLD can be integrated in this layered structure.

The second transistor 901 formed using a substrate 900 containing a semiconductor material can be either an n-channel transistor (nMOSFET) or a p-channel transistor (pMOSFET). In the example illustrated in FIG. 14, the second transistor 901 is electrically isolated from other elements by a shallow trench isolation (STI) 905. The use of the STI 905 can reduce generation of a bird's beak, which is caused by a local oxidation of silicon (LOCOS) element isolation method, in an element isolation region and can reduce the size of the element isolation region. On the other hand, in a semiconductor device that is not required to be structurally miniaturized or downsized, the STI 905 is not necessarily formed and an element isolation means such as LOCOS can be used. In the substrate 900 where the second transistor 901 is formed, a well 904 to which an impurity imparting conductivity, such as boron, phosphorus, or arsenic, is added is formed.

Figure 14:
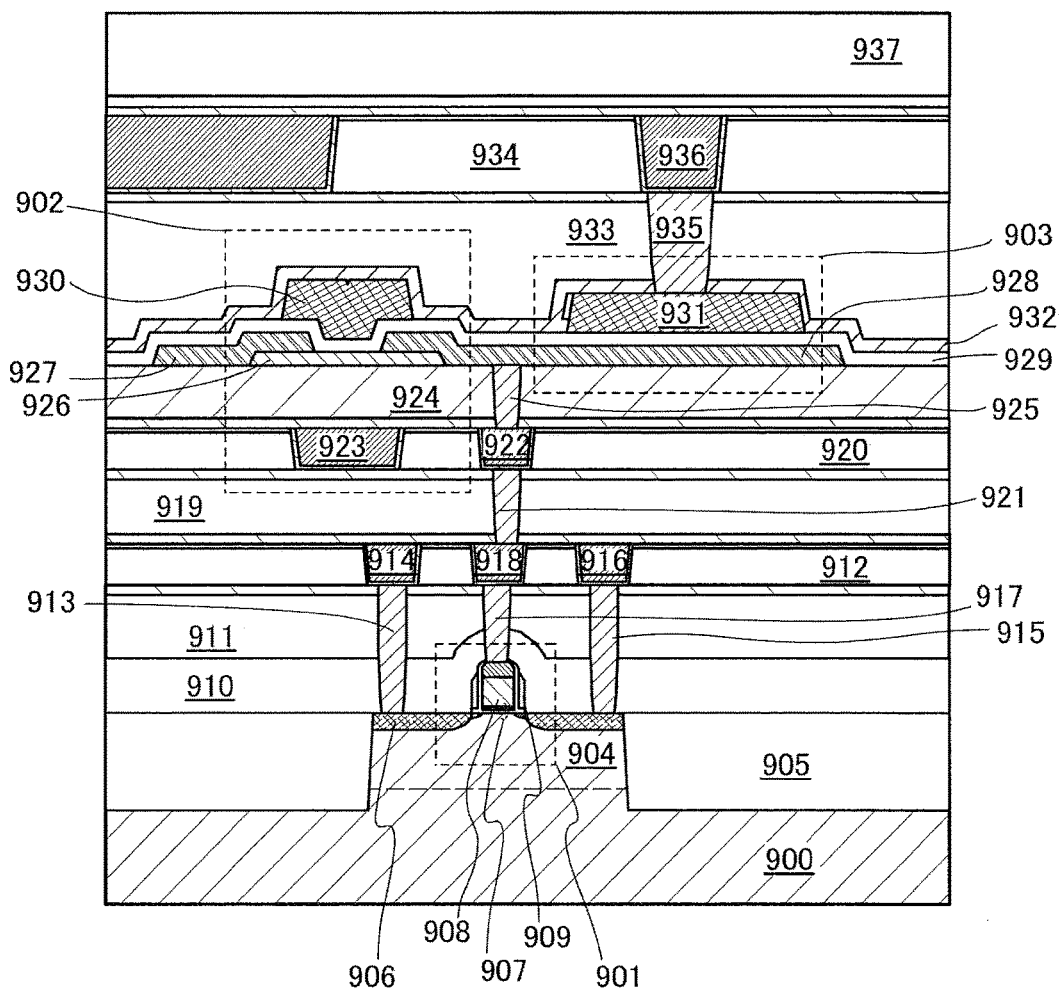
FIG. 14 is a cross-sectional view illustrating one embodiment of a semiconductor device.

The second transistor 901 in FIG. 14 includes a channel formation region in the substrate 900, impurity regions 906 (also referred to as a source region and a drain region) provided such that the channel formation region is placed therebetween, a gate insulating film 907 over the channel formation region, and a gate electrode layer 908 provided over the gate insulating film 907 to overlap with the channel formation region. The gate electrode layer 908 can have a stacked structure of a gate electrode layer including a first material for increasing processing accuracy and a gate electrode layer including a second material for decreasing the resistance as a wiring. For example, the gate electrode layer 908 can have a stacked structure of crystalline silicon to which an impurity imparting conductivity, such as phosphorus, is added and nickel silicide. Note that the structure is not limited to this, and materials, the number of stacked layers, the shape, or the like can be adjusted as appropriate depending on required specifications.

Note that the second transistor 901 illustrated in FIG. 14 may be a fin-type transistor. In a fin-type structure, part of a semiconductor substrate is processed into a plate-shaped protrusion, and a gate electrode layer is provided to cross the protrusion in the longitudinal direction. The gate electrode layer covers an upper surface and side surfaces of the protrusion with a gate insulating film placed between the gate electrode layer and the protrusion. With the second transistor having a fin-type structure, the channel width can be reduced to achieve higher integration of transistors. Moreover, a larger amount of current can flow through the transistor and the control efficiency can be increased, so that the off-state current and threshold voltage of the transistor can be reduced.

Contact plugs 913 and 915 are connected to the impurity regions 906 in the substrate 900. Here, the contact plugs 913 and 915 also function as a source electrode and a drain electrode of the second transistor 901. In addition, impurity regions that are different from the impurity regions 906 are provided between the impurity regions 906 and the channel formation region. The impurity regions function as LDD regions or extension regions for controlling the distribution of electric fields in the vicinity of the channel formation region, depending on the concentration of an impurity introduced thereto. Sidewall insulating films 909 are provided at side surfaces of the gate electrode layer 908 with an insulating film placed therebetween. By using this insulating film and the sidewall insulating films 909, the LDD regions or extension regions can be formed.

The second transistor 901 is covered with an insulating film 910. The insulating film 910 can function as a protective film and can prevent impurities from entering the channel formation region from the outside. With the insulating film 910 formed by CVD using a material such as silicon nitride, hydrogenation can be performed by heat treatment in the case where single crystal silicon is used for the channel formation region. When an insulating film having tensile stress or compressive stress is used as the insulating film 910, distortion can be provided to the semiconductor material used for the channel formation region. By application of tensile stress to a silicon material used for the channel formation region of an n-channel transistor or application of compressive stress to a silicon material used for the channel formation region of a p-channel transistor, the field-effect mobility of the transistor can be increased.

An insulating film 911 is provided over the insulating film 910, and a surface of the insulating film 911 is planarized by CMP. Consequently, element layers can be stacked with high accuracy above a layer including the second transistor 901.

A layer including the capacitor 903 and the first transistor 902 in which a channel is formed in an oxide semiconductor film is formed above the layer including the second transistor 901. The first transistor 902 is a top-gate transistor. The first transistor 902 includes a source electrode layer 927 and a drain electrode layer 928 in contact with side surfaces and an upper surface of an oxide semiconductor film 926, and includes a gate electrode layer 930 over a gate insulating film 929 placed over the oxide semiconductor film 926, the source electrode layer 927, and the drain electrode layer 928. An insulating film 932 is formed to cover the first transistor 902. Here, a method of fabricating the first transistor 902 will be described below.

The oxide semiconductor film 926 is formed over the insulating film 924. The insulating film 924 can be formed using an inorganic insulating film of silicon oxide, silicon nitride, silicon nitride oxide, silicon oxynitride, aluminum oxide, aluminum nitride, aluminum nitride oxide, or the like. In particular, the insulating film 924 is preferably formed using a material with a low dielectric constant (a low-k material) because capacitance due to overlap of electrodes or wirings can be sufficiently reduced. Note that the insulating film 924 may be a porous insulating film containing any of the above materials. Since the porous insulating film has lower dielectric constant than a dense insulating film, parasitic capacitance due to electrodes or wirings can be further reduced. In this embodiment, the insulating film 924 is a stack of a silicon oxide film with a thickness of about 300 nm on a 50-nm-thick aluminum oxide film.

The oxide semiconductor film 926 can be formed by processing an oxide semiconductor film formed over the insulating film 924 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is formed by sputtering using an oxide semiconductor target. Moreover, the oxide semiconductor film can be formed by sputtering under a rare gas (e.g., argon) atmosphere, an oxygen atmosphere, or a mixed atmosphere of a rare gas (e.g., argon) and oxygen.

Note that before the oxide semiconductor film is formed by sputtering, dust on a surface of the insulating film 924 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

As the oxide semiconductor, any of the following oxides can be used, for example: indium oxide, tin oxide, zinc oxide, two-component metal oxides such as In—Zn-based oxide, Sn—Zn-based oxide, Al—Zn-based oxide, Zn—Mg-based oxide, Sn—Mg-based oxide, In—Mg-based oxide, and In—Ga-based oxide; three-component metal oxides such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide; and four-component oxides such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide. The oxide semiconductor may contain silicon.

In this embodiment, an In—Ga—Zn-based oxide semiconductor thin film that has a thickness of 30 nm and is obtained by sputtering using a target including indium (In), gallium (Ga), and zinc (Zn) is used as the oxide semiconductor film. As the target, it is preferable to use a target having an atomic ratio of In:Ga:Zn=1:1:1, 4:2:3, 3:1:2, 1:1:2, 2:1:3, or 3:1:4. The filling rate of the target including In, Ga, and Zn is higher than or equal to 90% and lower than or equal to 100%, preferably higher than or equal to 95% and lower than 100%. With the use of the target with high filling rate, a dense oxide semiconductor film is formed.

In the case where an In—Zn-based material is used for the oxide semiconductor film, a target to be used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for formation of an In—Zn-based oxide semiconductor with an atomic ratio of In:Zn:O=X:Y:Z, the relation of Z>1.5X+Y is satisfied. The mobility can be improved by keeping the ratio of Zn within the above range.

In the case where an In—Sn—Zn-based oxide semiconductor film is formed as the oxide semiconductor film by sputtering, it is preferable to use an In—Sn—Zn—O target having an atomic ratio of In:Sn:Zn=1:1:1, 2:1:3, 1:2:2, or 20:45:35.

In this embodiment, the oxide semiconductor film is formed in such a manner that the substrate is held in a process chamber kept in a reduced pressure state, a sputtering gas from which hydrogen and moisture are removed is introduced while moisture remaining in the process chamber is removed, and the above-described target is used. The substrate temperature during the film formation may be higher than or equal to 100° C. and lower than or equal to 600° C., preferably higher than or equal to 200° C. and lower than or equal to 400° C. By forming the oxide semiconductor film while the substrate is heated, the concentration of impurities included in the formed oxide semiconductor film can be reduced. In addition, damage by sputtering can be reduced. In order to remove remaining moisture in the process chamber, an entrapment vacuum pump is preferably used. For example, a cryopump, an ion pump, or a titanium sublimation pump is preferably used. The evacuation unit may be a turbo pump provided with a cold trap. In the process chamber which is evacuated with the cryopump, for example, a hydrogen atom, a compound containing a hydrogen atom, such as water ($H_2O$), and the like are removed, whereby the impurity concentration in the oxide semiconductor film formed in the process chamber can be reduced.

As one example of the deposition conditions, the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current (DC) power source is preferably used because dust generated in deposition can be reduced and the film thickness can be made uniform.

When the leakage rate of the process chamber of the sputtering apparatus is set to $1\times10^{-10}$ Pa·m$^3$/s or less, entry of impurities such as an alkali metal or a hydride into the oxide semiconductor film that is formed by sputtering can be reduced. Further, with the use of an entrapment vacuum pump as an exhaustion system, counter flow of impurities such as an alkali metal, hydrogen atoms, hydrogen molecules, water, or a hydride from the exhaustion system can be reduced.

When the purity of the target is set to 99.99% or higher, an alkali metal, hydrogen atoms, hydrogen molecules, water, a hydroxyl group, a hydride, or the like mixed into the oxide semiconductor film can be reduced. In addition, when the above target is used, the concentration of an alkali metal such as lithium, sodium, or potassium can be reduced in the oxide semiconductor film.

In order that the oxide semiconductor film contains as little hydrogen, a hydroxyl group, and moisture as possible, it is preferable that impurities such as moisture or hydrogen that are adsorbed on the substrate 900 be desorbed and exhausted by preheating of the substrate 900 over which the insulating film 924 is formed in a preheating chamber of a sputtering apparatus, as pretreatment for deposition. The temperature for the preheating is higher than or equal to 100° C. and lower than or equal to 400° C., preferably higher than or equal to 150° C. and lower than or equal to 300° C. As an evacuation unit provided in the preheating chamber, a cryopump is preferably used. Note that this preheating treatment can be omitted.

Note that etching for forming the oxide semiconductor film 926 may be dry etching, wet etching, or both dry etching and wet etching. As an etching gas used for dry etching, it is preferable to use a gas containing chlorine (a chlorine-based gas such as chlorine ($Cl_2$), boron trichloride ($BCl_3$), silicon tetrachloride ($SiCl_4$), or carbon tetrachloride ($CCl_4$)). Alternatively, it is possible to use a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like.

As the dry etching method, a parallel plate RIE (reactive ion etching) method or an ICP (inductively coupled plasma) etching method can be used. In order to etch the film into a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor film 926 may be formed by an inkjet method. Formation of the resist mask by an inkjet method needs no photomask; thus, fabrication cost can be reduced.

Note that it is preferable that reverse sputtering be performed before the formation of a conductive film in a subsequent step so that a resist residue and the like that attach onto surfaces of the oxide semiconductor film 926 and the insulating film 924 are removed.

Note that the oxide semiconductor film formed by sputtering or the like sometimes contains a large amount of moisture or hydrogen (including a hydroxyl group) as impurities. Moisture or hydrogen easily forms donor levels and thus serves as impurities in the oxide semiconductor. Therefore, in one embodiment of the present invention, in order to reduce impurities such as moisture and hydrogen in the oxide semiconductor film (dehydrate or dehydrogenate the oxide semiconductor film), the oxide semiconductor film 926 is subjected to heat treatment in a reduced-pressure atmosphere, an inert gas atmosphere of nitrogen, a rare gas, or the like, an oxygen gas atmosphere, or an ultra-dry air atmosphere (with a moisture content of 20 ppm (−55° C. by conversion into a dew point) or less, preferably 1 ppm or less, further preferably 10 ppb or less, in the case where the measurement is performed by a dew point meter of a cavity ring down laser spectroscopy (CRDS) system).

By performing heat treatment on the oxide semiconductor film 926, moisture or hydrogen in the oxide semiconductor film 926 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 minutes to 6 minutes. When RTA is used for the heat treatment, dehydration or dehydrogenation can be performed in a short time; thus, treatment can be performed even at a temperature higher than the strain point of a glass substrate.

In this embodiment, an electric furnace which is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal annealing) apparatus such as a GRTA (gas rapid thermal annealing) apparatus, or an LRTA (lamp rapid thermal annealing) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (i.e., the impurity concentration is preferably 1 ppm or lower, more preferably 0.1 ppm or lower).

Through the above-described steps, the concentration of hydrogen in the oxide semiconductor film 926 can be reduced and the oxide semiconductor film 926 is highly purified. Thus, the oxide semiconductor film can be stable. In addition, by using the oxide semiconductor film in which the hydrogen concentration is reduced and the purity is improved, it is possible to fabricate a transistor with high withstand voltage and extremely small off-state current. The above heat treatment can be performed at any time after the oxide semiconductor film is formed.

A structure of an oxide semiconductor film is described below.

The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, the CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

The CAAC-OS film is an oxide semiconductor film having a low impurity concentration. The impurity means an element other than main components of the oxide semiconductor film, such as hydrogen, carbon, silicon, or a transition metal element. In particular, an element (e.g., silicon) having higher strength of bonding to oxygen than a metal element included in the oxide semiconductor film takes oxygen away in the oxide semiconductor film to disrupt the atomic arrangement in the oxide semiconductor film, which causes a lowering of the crystallinity of the oxide semiconductor film. A heavy metal such as iron or nickel, argon, carbon dioxide, or the like has a large atomic radius (or molecular radius), and thus disrupts the atomic arrangement in the oxide semiconductor film when included in the oxide semiconductor film, which causes a lowering of the crystallinity of the oxide semiconductor film. Note that the impurity included in the oxide semiconductor film serves as a carrier trap or a carrier generation source in some cases.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (few oxygen vacancies) is referred to as "highly purified intrinsic" or "substantially highly purified intrinsic". A highly purified intrinsic or substantially highly purified intrinsic oxide semiconductor film has few carrier generation sources, and thus has a low carrier density. Thus, a transistor including the oxide semiconductor film rarely has a negative threshold voltage (rarely has normally-on characteristics). A highly purified intrinsic or substantially highly purified intrinsic oxide semiconductor film has few carrier traps. Thus, the transistor including the oxide semiconductor film has a small variation in electrical characteristics and accordingly has high reliability. Charges trapped by the carrier traps in the oxide semiconductor film take a long time to be released and may behave like fixed charges. Thus, the transistor including the oxide semiconductor film with a high impurity concentration and a high density of defect states has unstable electrical characteristics in some cases.

In a transistor using the CAAC-OS film, change in electric characteristics due to irradiation with visible light or ultraviolet light is small.

Next, the source electrode layer 927 and the drain electrode layer 928 are formed by a photolithography process. Specifically, the source electrode layer 927 and the drain electrode layer 928 can be formed in such a manner that a conductive film is formed over the insulating film 924 by sputtering or vacuum evaporation and then processed (patterned) into a predetermined shape.

The source electrode layer 927 and the drain electrode layer 928 can be formed using an element selected from aluminum, chromium, copper, tantalum, titanium, molybdenum, and tungsten; an alloy containing any of these elements as a component; an alloy containing any of these elements in combination; or the like. Alternatively, the source electrode layer 927 and the drain electrode layer 928 may have a structure in which a film of a refractory metal such as chromium, tantalum, titanium, molybdenum, or tungsten is stacked over or below a metal film of aluminum, copper, or the like. Aluminum and copper are preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film to be the source electrode layer 927 and the drain electrode layer 928 may have a single-layer structure or a stacked structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesiveness with an oxide film; therefore, when the source electrode layer 927 and the drain electrode layer 928 have a stacked structure in which a conductive film of Cu is stacked over a conductive film of a Cu—Mg—Al alloy, a Mo—Ti alloy, Ti, or Mo, the adhesion between the insulating film 924 and the source and drain electrode layers 927 and 928 can be increased.

For the conductive film to be the source electrode layer 927 and the drain electrode layer 928, a conductive metal oxide may be used. As the conductive metal oxide, indium oxide, tin oxide, zinc oxide, a mixture of indium oxide and tin oxide, a mixture of indium oxide and zinc oxide, or the conductive metal oxide material containing silicon or silicon oxide can be used.

In the case where heat treatment is performed after the formation of the conductive film, the conductive film preferably has heat resistance high enough to withstand the heat treatment.

In this embodiment, a 100-nm-thick tungsten film is used for the source electrode layer 927 and the drain electrode layer 928.

Note that the materials and etching conditions are adjusted as appropriate so that the oxide semiconductor film 926 is not removed as much as possible in etching of the conductive film. Depending on the etching conditions, an exposed portion of the oxide semiconductor film 926 is partially etched and thus a groove (a recessed portion) is formed in some cases.

In this embodiment, a tungsten film is used as the conductive film to be the source electrode layer 927 and the drain electrode layer 928. Thus, wet etching can be selectively performed on the conductive film using a solution containing ammonia and hydrogen peroxide water (an ammonia hydrogen peroxide mixture). As the ammonia hydrogen peroxide mixture, a solution in which 31 wt % hydrogen peroxide water, 28 wt % ammonia water, and water are mixed at a volume ratio of 5:2:2 is specifically used. Alternatively, dry etching may be performed on the conductive film with the use of a gas containing carbon tetrafluoride ($CF_4$), chlorine ($Cl_2$), or oxygen.

In order to reduce the number of photomasks and steps in a photolithography process, etching may be performed with the use of a resist mask formed using a multi-tone mask which is a light-exposure mask through which light is transmitted so as to have a plurality of intensities. A resist mask formed using a multi-tone mask has a plurality of thicknesses and can be changed in shape by etching; thus, the resist mask can be used in a plurality of etching steps for processing films into different patterns. Thus, a resist mask corresponding to at least two kinds of different patterns can be formed by one multi-tone mask. As a result, the number of light-exposure masks can be reduced and the number of corresponding photolithography processes can also be reduced, whereby the fabrication process can be simplified.

Further, oxide conductive films functioning as a source region and a drain region may be provided between the oxide semiconductor film 926 and the source and drain electrode layers 927 and 928. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive films are formed, etching for forming the oxide conductive films and etching for forming the source electrode layer 927 and the drain electrode layer 928 may be performed concurrently.

By providing the oxide conductive films functioning as the source and drain regions, the resistance between the oxide semiconductor film 926 and the source and drain electrode layers 927 and 928 can be lowered, so that the transistor can operate at high speed. In addition, with the oxide conductive films functioning as the source and drain regions, the withstand voltage of the transistor can be increased.

Next, plasma treatment may be performed using a gas such as $N_2O$, $N_2$, or Ar. By this plasma treatment, water or the like attached onto an exposed surface of the oxide semiconductor film is removed. Plasma treatment may be performed using a mixture gas of oxygen and argon as well.

After the plasma treatment, the gate insulating film 929 is formed to cover the source and drain electrode layers 927 and 928 and the oxide semiconductor film 926. Then, over the gate insulating film 929, the gate electrode layer 930 is formed to overlap with the oxide semiconductor film 926 and a conductive film to be an upper electrode layer 931 of the capacitor is formed.

The gate insulating film 929 can be formed using a silicon oxynitride film, for example. Note that the gate insulating film 929 preferably includes impurities such as moisture or hydrogen as little as possible, and the gate insulating film 929 may be a single-layer insulating film or a plurality of insulating films stacked. If hydrogen is contained in the gate insulating film 929, hydrogen enters the oxide semiconductor film 926 or oxygen in the oxide semiconductor film 926 is extracted by hydrogen, whereby the oxide semiconductor film 926 has lower resistance (n-type conductivity) and a parasitic channel might be formed as a result. Thus, it is important that a deposition method in which hydrogen is not used be employed in order to form the gate insulating film 929 containing hydrogen as little as possible. A material having a high barrier property is preferably used for the gate insulating film 929. As the insulating film having a high barrier property, a silicon nitride film, a silicon nitride oxide film, an aluminum nitride film, or an aluminum nitride oxide film can be used, for example. When a plurality of insulating films stacked are used, an insulating film having a lower proportion of nitrogen, such as a silicon oxide film or a silicon oxynitride film, is formed closer to the oxide semiconductor film 926 than the insulating film having a high barrier property. Then, the insulating film having a high barrier property is formed to overlap with the source and drain electrode layers 927 and 928 and the oxide semiconductor film 926 with the insulating film having a lower proportion of nitrogen placed therebetween. With the use of the insulating film having a high barrier property, impurities such as moisture and hydrogen can be prevented from entering the oxide semiconductor film 926, the gate insulating film 929, or the interface between the oxide semiconductor film 926 and another insulating film and the vicinity thereof. In addition, the insulating film having a lower proportion of nitrogen such as a silicon oxide film or a silicon oxynitride film is formed in contact with the oxide semiconductor film 926, so that the insulating film formed using a material having a high barrier property can be prevented from being in direct contact with the oxide semiconductor film 926.

In this embodiment, a 20-nm-thick silicon oxynitride film formed by sputtering is used as the gate insulating film 929. The substrate temperature during the film formation may be higher than or equal to room temperature and lower than or equal to 400° C. and in this embodiment, is 300° C.

After the gate insulating film 929 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the water content in the gas be 20 ppm or less, preferably 1 ppm or less, further preferably 10 ppb or less. In this embodiment, for example, heat treatment is performed at 250° C. for 1 hour in a nitrogen atmosphere. Alternatively, RTA treatment for a short time at a high temperature may be performed before the formation of the source and drain electrode layer 927 and 928 in a manner similar to that of the heat treatment performed on the oxide semiconductor film for reduction of moisture or hydrogen. Even when oxygen vacancies are generated in the oxide semiconductor film 926 by the previous heat treatment performed on the oxide semiconductor film 926, oxygen is supplied to the oxide semiconductor film 926 from the gate insulating film 929 by performing heat treatment after the gate insulating film 929 containing oxygen is provided. By the supply of oxygen to the oxide semiconductor film 926, oxygen vacancies that serve as donors can be reduced in the oxide semiconductor film 926 and the stoichiometric composition can be satisfied. As a result, the oxide semiconductor film 926 can be made to be substantially i-type and variation in electrical characteristics of the transistor due to oxygen vacancies can be reduced; thus, electrical characteristics can be improved. There is no particular limitation on the timing of this heat treatment as long as it is after the formation of the gate insulating film 929. When this heat treatment doubles as another step, the oxide semiconductor film 926 can be made to be substantially i-type without increase in the number of steps.

Moreover, oxygen vacancies that serve as donors in the oxide semiconductor film 926 may be reduced by subjecting the oxide semiconductor film 926 to heat treatment in an oxygen atmosphere so that oxygen is added to the oxide semiconductor. The heat treatment is performed at a temperature, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably 6N (99.9999%) or higher, further preferably 7N (99.99999%) or higher (i.e., the impurity concentration in the oxygen gas is preferably 1 ppm or lower, further preferably 0.1 ppm or lower).

Alternatively, oxygen may be added to the oxide semiconductor film 926 by ion implantation, ion doping, or the like to reduce oxygen vacancies serving as donors. For example, oxygen that is made into a plasma state with a microwave at 2.45 GHz may be added to the oxide semiconductor film 926.

The gate electrode layer 930 and the upper electrode layer 931 can be formed in such a manner that a conductive film is formed over the gate insulating film 929 and then is patterned.

The thickness of each of the gate electrode layer 930 and the upper electrode layer 931 is 10 nm to 400 nm, preferably 100 nm to 300 nm. In this embodiment, the gate electrode layer 930 and the upper electrode layer 931 are formed in the following manner: a 135-nm-thick tungsten film is stacked over a 30-nm-thick tantalum nitride film by sputtering to form a conductive film for the gate electrode, and then, the conductive film is processed (patterned) into a desired shape by etching. Note that a resist mask may be formed by an inkjet method. Formation of the resist mask by an inkjet method needs no photomask; thus, fabrication cost can be reduced.

Through the above steps, the first transistor 902 is formed.

Note that the first transistor 902 is described as a single-gate transistor; if necessary, it is possible to fabricate a multi-gate transistor that includes a plurality of gate electrodes electrically connected to each other and thus includes a plurality of channel formation regions.

In the fabrication method described above, the source electrode layer 927 and the drain electrode layer 928 are formed after the oxide semiconductor film 926. Accordingly, as illustrated in FIG. 14, in the first transistor 902 obtained by the fabrication method, the source electrode layer 927 and the drain electrode layer 928 are formed over the oxide semiconductor film 926. Alternatively, in the first transistor 902, the source and drain electrode layers 927 and 928 may be formed below the oxide semiconductor film 926, that is, between the oxide semiconductor film 926 and the insulating film 924.

Note that an insulating film in contact with the oxide semiconductor film 926 may be formed using an insulating material containing an element that belongs to Group 13 and oxygen. Many of oxide semiconductor materials contain a Group 13 element, and an insulating material containing a Group 13 element is compatible with an oxide semiconductor. Thus, when an insulating material containing a Group 13 element is used for the insulating film in contact with the oxide semiconductor film, the state of the interface between the oxide semiconductor film and the insulating film can be kept favorable.

An insulating material containing a Group 13 element is an insulating material containing one or more elements that belong to Group 13 of the periodic table. Examples of the insulating material containing a Group 13 element are gallium oxide, aluminum oxide, aluminum gallium oxide, and gallium aluminum oxide. Here, aluminum gallium oxide refers to a material in which the aluminum content is higher than the gallium content in atomic percent, and gallium aluminum oxide refers to a material in which the gallium content is higher than or equal to the aluminum content in atomic percent.

For example, when a material containing gallium oxide is used for an insulating film that is in contact with an oxide semiconductor film containing gallium, characteristics at the interface between the oxide semiconductor film and the insulating film can be kept favorable. For example, the oxide semiconductor film and an insulating film containing gallium oxide are provided in contact with each other, so that pileup of hydrogen at the interface between the oxide semiconductor film and the insulating film can be reduced. Note that a similar effect can be obtained in the case where an element in the same group as a constituent element of the oxide semiconductor is used in an insulating film. For example, it is effective to form an insulating film with the use of a material containing aluminum oxide. Note that aluminum oxide has a property of not easily transmitting water. Thus, it is preferable to use a material containing aluminum oxide in terms of preventing entry of water into the oxide semiconductor film.

The insulating material of the insulating film in contact with the oxide semiconductor film 926 is preferably made to contain oxygen in a proportion higher than that of the stoichiometric composition by heat treatment in an oxygen atmosphere or by oxygen doping. "Oxygen doping" refers to addition of oxygen into a bulk. Note that the term "bulk" is used in order to clarify that oxygen is added not only to a surface of a thin film but also to the inside of the thin film In addition, "oxygen doping" includes oxygen plasma doping in which oxygen that is made to be plasma is added to a bulk. The oxygen doping may be performed by an ion implantation method or an ion doping method.

By oxygen doping, an insulating film that includes a region where the proportion of oxygen is higher than that of the stoichiometric composition can be formed. When the insulating film including such a region is in contact with the oxide semiconductor film, excess oxygen in the insulating film is supplied to the oxide semiconductor film, and oxygen defects in the oxide semiconductor film or at the interface between the oxide semiconductor film and the insulating film are reduced. Thus, the oxide semiconductor film can be made to be an i-type or substantially i-type oxide semiconductor.

Note that the insulating film including a region where the proportion of oxygen is higher than that of the stoichiometric composition may be used as either the insulating film placed above the oxide semiconductor film 926 or the insulating film placed below the oxide semiconductor film 926 of the insulating films in contact with the oxide semiconductor film 926; however, it is preferable to use such an insulating film as both of the insulating films in contact with the oxide semiconductor film 926. The above-described effect can be enhanced with a structure where the insulating films including a region where the proportion of oxygen is higher than that of the stoichiometric composition are used as insulating films placed above and below the insulating films in contact with the oxide semiconductor film 926 so that the oxide semiconductor film 926 is sandwiched between the insulating films.

The insulating films placed above and below the oxide semiconductor film 926 may contain the same constituent elements or different constituent elements. The insulating film in contact with the oxide semiconductor film 926 may be a stack of insulating films each including a region where the proportion of oxygen is higher than that of the stoichiometric composition.

Note that in this embodiment, the first transistor 902 has a top-gate structure. The first transistor 902 includes a backgate electrode layer 923. With the backgate electrode layer, the first transistor 902 can serve as a normally-off transistor. For example, when the potential of the backgate electrode layer 923 is set at GND or a fixed potential, the threshold voltage of the first transistor 902 can shift further in a positive direction, which leads to the formation of a normally-off transistor.

In order to electrically connect the second transistor 901, the first transistor 902, and the capacitor 903 to form an electric circuit, one or more wiring layers for connecting these elements are stacked between layers and on the upper layer.

In FIG. 14, to form one memory element in Embodiment 3, for example, one of the source and the drain of the second transistor 901 is electrically connected to a wiring layer 914 through the contact plug 913. The wiring layer 914 is electrically connected to a wiring configured to supply a low potential. The other of the source and the drain of the second transistor 901 is electrically connected to a wiring layer 916 through the contact plug 915. The wiring layer 916 is electrically connected to a selector including a plurality of transistors. The gate of the second transistor 901 is electrically connected to the drain electrode layer 928 of the first transistor 902 through a contact plug 917, a wiring layer 918, a contact plug 921, a wiring layer 922, and a contact plug 925. Although not illustrated, the gate electrode layer 930 of the first transistor 902 is electrically connected to a writing control line. The drain electrode layer 928 is extended to the right in FIG. 14 and functions as a lower electrode layer of the capacitor 903. The gate insulating film 929 of the first transistor 902 is provided over the drain electrode layer 928. In a region where the capacitor 903 is formed, the gate insulating film 929 functions as an interelectrode dielectric film of the capacitor 903. The upper electrode layer 931 is provided over the interelectrode dielectric film and electrically connected to a wiring layer 936 through a contact plug 935. The wiring layer 936 is a reading control line in the memory element.

The wiring layers 914, 916, 918, 922, and 936 and the backgate electrode layer 923 are embedded in insulating films. These wiring layers and the like are preferably formed using a low-resistance conductive material such as copper or aluminum. Alternatively, the wiring layers can be formed using graphene formed by CVD as a conductive material. Graphene is a one-atom thick sheet of $sp^2$-bonded carbon molecules or a stack of 2 to 100 sheets of the carbon molecules. Examples of a method of manufacturing such graphene are thermal CVD by which graphene is formed on a metal catalyst; and plasma CVD by which graphene is formed from methane, without using a catalyst, by plasma generated locally with ultraviolet light irradiation.

By using such a low-resistance conductive material, RC delay of signals transmitted through the wiring layers can be reduced. When copper is used for the wiring layers, a barrier film is formed in order to prevent copper from diffusing into the channel formation region. The barrier film can be a tantalum nitride film, a stack of a tantalum nitride film and a tantalum film, a titanium nitride film, or a stack of a titanium nitride film and a titanium film, for example, but is not limited to a film containing such materials as long as the film has a function of preventing diffusion of a wiring material and has adhesion to the wiring material, a base film, or the like. The barrier film may be formed as a layer that is independently formed, or may be formed in such a manner that a material of the barrier film is included in a wiring material and precipitated by heat treatment on the inner wall of an opening provided in an insulating film.

The insulating films 911, 912, 919, 920, 933, and 934 can be formed using an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), tetraethylorthosilicate (TEOS) which is silicon oxide prepared from $Si(OC_2H_5)_4$, hydrogen silsesquioxane (HSQ), methyl silsesquioxane (MSQ), organosilicate glass (OSG), or an organic polymer-based material. In the case of advancing miniaturization of a semiconductor device, parasitic capacitance between wirings is significant and signal delay is increased; therefore, the relative permittivity of silicon oxide (k=4.0 to 4.5) is too high, and a material with k=3.0 or less is preferably used. In addition, since CMP treatment is performed after the wirings are embedded in the insulating films, the insulating films need to have high mechanical strength. The insulating films can be made porous to have a lower dielectric constant as long as their mechanical strength can be secured. The insulating films are formed by sputtering, CVD, a coating method including spin coating (also referred to as spin on glass (SOG)), or the like.

An insulating film functioning as an etching stopper for planarization treatment by CMP or the like that is performed after the wiring material is embedded in the insulating films 911, 912, 919, 920, 933, and 934 may be additionally provided.

Barrier films are provided over the wiring layers 914, 916, 918, 922, and 936 and the backgate electrode layer 923, and a protective film is provided over each barrier film. The barrier film is provided in order to prevent diffusion of the wiring material such as copper. The barrier film can be formed using an insulating material such as silicon nitride, SiC, or SiBON. Note that a thick barrier film increases capacitance between wirings; therefore, a material having a barrier property and a low dielectric constant is preferably used.

Each of the contact plugs 913, 915, 917, 921, 925, and 935 is formed in such a manner that an opening (a via hole) with a high aspect ratio is formed in the insulating film and is filled with a conductive material such as tungsten. The opening is formed preferably by highly anisotropic dry etching and particularly preferably by reactive ion etching (RIE). The inner wall of the opening is covered with a barrier film (diffusion prevention film) formed of a titanium film, a titanium nitride film, a stack of such films, or the like, and a material such as tungsten or polysilicon doped with phosphorus or the like fills the opening. For example, tungsten is embedded in the via hole by blanket CVD, and an upper surface of the contact plug is planarized by CMP.

A protective insulating film 937 is provided in the top layer and prevents moisture and contaminant from entering a semiconductor device from the outside. The protective insulating film 937 can have a single-layer structure or a stacked structure using a material such as silicon nitride, silicon oxynitride, or silicon nitride oxide.

With the above-described structure in which a transistor that includes a first semiconductor material and is capable of operating at high speed is used in combination with a transistor that includes a second semiconductor material and has significantly small off-state current, it is possible to fabricate a PLD that includes a logic circuit capable of operating at high speed with low power.

This embodiment can be implemented in an appropriate combination with any of the other embodiments.

Embodiment 9

The PLD according to one embodiment of the present invention can be used for electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy.

Examples of consumer products among such electronic devices are display devices, personal computers, and image reproducing devices provided with recording media (devices that reproduce the content of recording media such as digital versatile discs (DVDs) and have displays for displaying the reproduced images). Other examples of electronic devices that can include the semiconductor device or the PLD according to one embodiment of the present invention are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 15A to 15F illustrate specific examples of these electronic devices.

Figure 15A:
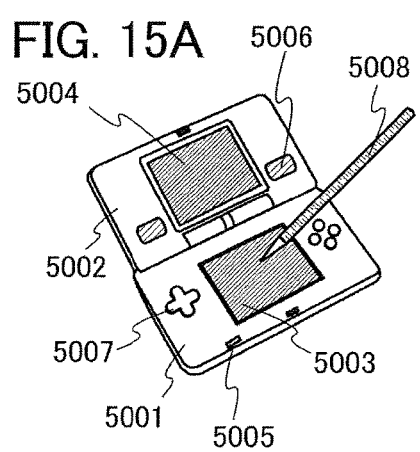
FIGS. 15A to 15F each illustrate an electronic device.

FIG. 15A illustrates a portable game console including a housing 5001, a housing 5002, a display portion 5003, a display portion 5004, a microphone 5005, a speaker 5006, an operation key 5007, a stylus 5008, and the like. Note that although the portable game console illustrated in FIG. 15A has the two display portions 5003 and 5004, the number of display portions included in the portable game console is not limited to two.

Figure 15B:
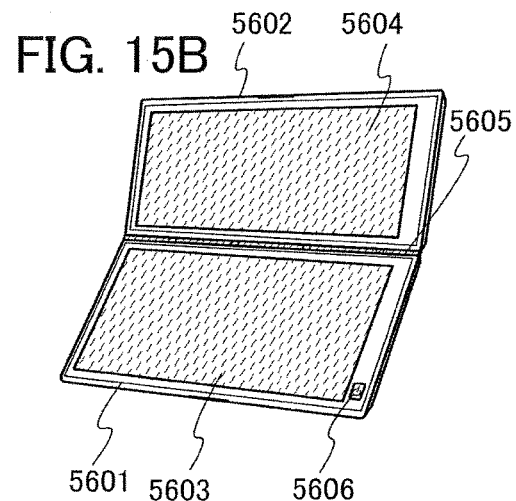

FIG. 15B illustrates a portable information terminal including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel area of a display device.

Figure 15C:
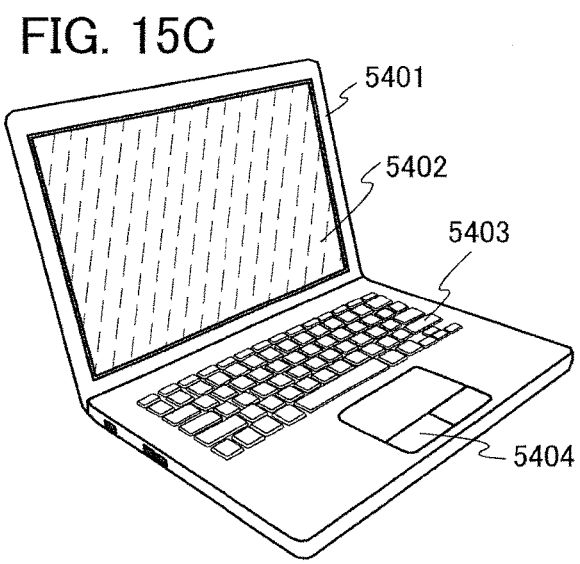

FIG. 15C illustrates a laptop including a housing 5401, a display portion 5402, a keyboard 5403, a pointing device 5404, and the like.

Figure 15D:
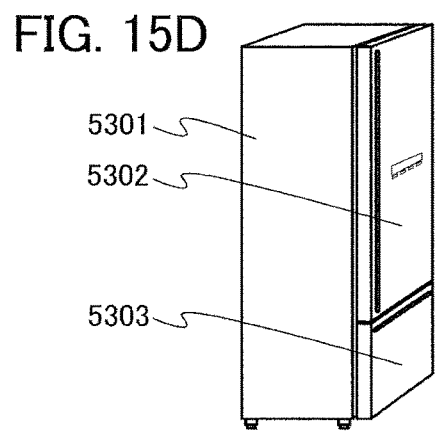

FIG. 15D illustrates an electric refrigerator-freezer including a housing 5301, a refrigerator door 5302, a freezer door 5303, and the like.

Figure 15E:
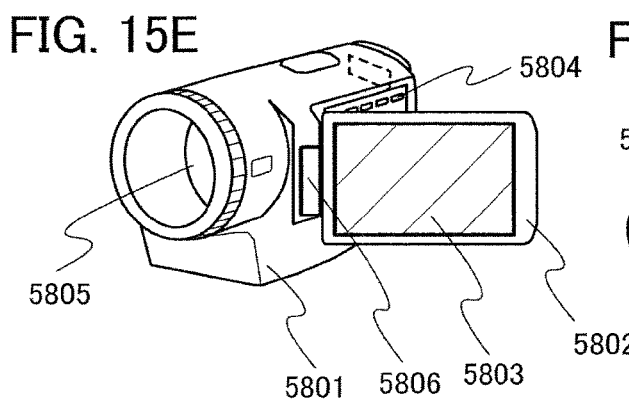

FIG. 15E illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 15F:
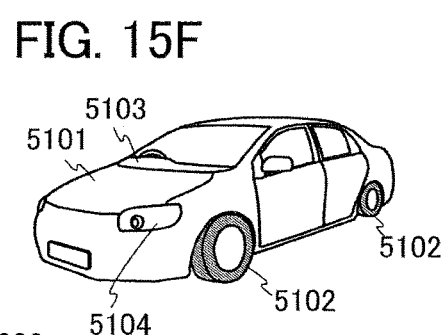

FIG. 15F illustrates a passenger car including a car body 5101, wheels 5102, a dashboard 5103, lights 5104, and the like.

This embodiment can be implemented in an appropriate combination with any of the other embodiments.

This application is based on Japanese Patent Application serial no. 2012-123061 filed with Japan Patent Office on May 30, 2012, the entire contents of which are hereby incorporated by reference.

What is claimed is:
1. A semiconductor device comprising:
   a first circuit;
   a second circuit; and
   an output portion,
   wherein the first circuit comprises:
      a first transistor;
      a second transistor; and
      a capacitor,
   wherein one of a source and a drain of the first transistor is electrically connected to a gate of the second transistor,
   wherein the second circuit comprises a third transistor,
   wherein one of a source and a drain of the second transistor is electrically connected to one of a source and a drain of the third transistor,
   wherein the capacitor is electrically connected to the gate of the second transistor, and
   wherein the other of the source and the drain of the third transistor is electrically connected to the output portion.
2. The semiconductor device according to claim 1,
   wherein a gate of the first transistor is electrically connected to a first wiring, and
   wherein the other of the source and the drain of the first transistor is electrically connected to a second wiring.
3. The semiconductor device according to claim 1,
   wherein the second circuit comprises a plurality of third circuits each comprising an input terminal, an inverter and a fourth transistor, and
   wherein conduction between the first circuit and the output portion depends on a conduction state of the fourth transistor, the conduction state being determined by a signal input from the input terminal.

4. The semiconductor device according to claim 1, further comprising a first precharge circuit electrically connected to the output portion.

5. The semiconductor device according to claim 1, further comprising a second precharge circuit electrically connected to the other of the source and the drain of the second transistor.

6. The semiconductor device according to claim 1, further comprising a latch circuit between the third transistor and the output portion.

7. The semiconductor device according to claim 1,
wherein the first transistor comprises an oxide semiconductor layer, wherein a channel is formed in the oxide semiconductor layer.

8. A semiconductor device comprising:
a first circuit;
a second circuit; and
an output portion,
wherein the first circuit comprises:
  a first transistor;
  a second transistor; and
  a third transistor,
wherein one of a source and a drain of the first transistor is electrically connected to a gate of the second transistor,
wherein one of a source and a drain of the second transistor is electrically connected to one of a source and a drain of the third transistor,
wherein the second circuit comprises a fourth transistor,
wherein the other of the source and the drain of the third transistor is electrically connected to one of a source and a drain of the fourth transistor, and
wherein the other of the source and the drain of the fourth transistor is electrically connected to the output portion.

9. The semiconductor device according to claim 8,
wherein a gate of the first transistor is electrically connected to a first wiring, and
wherein the other of the source and the drain of the first transistor is electrically connected to a second wiring.

10. The semiconductor device according to claim 8,
wherein the second circuit comprises a plurality of third circuits each comprising an input terminal, an inverter and a fifth transistor, and
wherein conduction between the first circuit and the output portion depends on a conduction state of the fifth transistor, the conduction state being determined by a signal input from the input terminal.

11. The semiconductor device according to claim 8, further comprising a first precharge circuit electrically connected to the output portion.

12. The semiconductor device according to claim 8, further comprising a second precharge circuit electrically connected to the other of the source and the drain of the second transistor.

13. The semiconductor device according to claim 8,
wherein the first transistor comprises an oxide semiconductor layer, wherein a channel is formed in the oxide semiconductor layer.

* * * * *